(12) United States Patent
Mouttet

(10) Patent No.: US 9,965,251 B2
(45) Date of Patent: May 8, 2018

(54) CROSSBAR ARITHMETIC AND SUMMATION PROCESSOR

(76) Inventor: Blaise Laurent Mouttet, Arlington, VA (US)

( * ) Notice: Subject to any disclaimer, the term of this patent is extended or adjusted under 35 U.S.C. 154(b) by 3348 days.

(21) Appl. No.: 12/007,174

(22) Filed: Jan. 8, 2008

(65) Prior Publication Data

US 2008/0147954 A1    Jun. 19, 2008

Related U.S. Application Data

(63) Continuation-in-part of application No. 11/395,232, filed on Apr. 3, 2006.

(51) Int. Cl.
*G06F 7/38* (2006.01)
*G06F 7/60* (2006.01)
*H03K 19/177* (2006.01)
*G11C 13/00* (2006.01)

(52) U.S. Cl.
CPC .......... *G06F 7/607* (2013.01); *H03K 19/177* (2013.01); *G11C 13/00* (2013.01)

(58) Field of Classification Search
None
See application file for complete search history.

(56) References Cited

U.S. PATENT DOCUMENTS 4,064,421 A * 12/1977 Gajski et al. ................ 708/234
4,633,386 A * 12/1986 Terepin ......................... 710/317
5,010,505 A    4/1991 Falk et al.
5,029,120 A * 7/1991 Brodeur et al. ............... 708/272
5,223,750 A    6/1993 Nichogi et al.
5,249,144 A * 9/1993 Falk ............................... 708/191
5,272,359 A   12/1993 Nagasubramanian et al.
5,307,065 A * 4/1994 Tokuhiro ....................... 341/153
6,128,214 A   10/2000 Kuekes et al.
6,248,674 B1   6/2001 Kamins et al.
6,256,767 B1   7/2001 Kuekes et al.
6,314,019 B1  11/2001 Kuekes et al.
6,432,740 B1   8/2002 Chen
6,518,156 B1   2/2003 Chen et al.
6,531,371 B2   3/2003 Hsu et al.
6,574,130 B2   6/2003 Segal et al.
6,586,965 B2   7/2003 Kuekes et al.
6,671,710 B2  12/2003 Ovshinsky et al.
6,693,821 B2 * 2/2004 Hsu et al. ...................... 365/158
6,746,971 B1   6/2004 Ngo et al.
6,812,117 B1  11/2004 Tringe (Continued)

FOREIGN PATENT DOCUMENTS

EP      1331671      7/2003

OTHER PUBLICATIONS

Das et al., Architectures and Simulations for Nanoprocessor Systems Integrated on the Molecular Scale, Introducing Molecular Electronics, 2005, Chap. 17.*

(Continued)

*Primary Examiner* — Francisco Aponte

(57) ABSTRACT

A processor includes a crossbar array including row wires and column wires wherein bit patterns representative of numerical values are stored in a plurality of columns of the crossbar array in the form of high or low resistance states. An output unit electrically connected to the rows of the crossbar array is configured to sum the numerical values stored in the columns of the crossbar array.

18 Claims, 27 Drawing Sheets

(56) References Cited

U.S. PATENT DOCUMENTS

| | | | |
|---|---|---|---|
| 6,835,575 B2 | 12/2004 | Chen | |
| 6,846,682 B2 | 1/2005 | Heath et al. | |
| 6,854,092 B2 | 2/2005 | Hogg | |
| 6,867,996 B2 * | 3/2005 | Campbell et al. | 365/100 |
| 6,870,394 B2 | 3/2005 | Kuekes | |
| 6,880,146 B2 | 4/2005 | Snider | |
| 6,898,098 B2 * | 5/2005 | Snider et al. | 365/49.18 |
| 6,900,479 B2 | 5/2005 | DeHon et al. | |
| 6,919,740 B2 | 7/2005 | Snider | |
| 6,920,545 B2 | 7/2005 | Farwell et al. | |
| 6,960,783 B2 | 11/2005 | Lan et al. | |
| 6,963,077 B2 * | 11/2005 | DeHon et al. | 257/9 |
| 6,995,649 B2 | 2/2006 | Nugent | |
| 6,998,333 B2 | 2/2006 | Chen | |
| 7,184,297 B2 * | 2/2007 | Yasuda et al. | 365/148 |
| 7,203,789 B2 | 4/2007 | Snider | |
| 7,441,267 B1 * | 10/2008 | Elliott | 726/13 |
| 7,459,927 B2 * | 12/2008 | Bedard | 326/1 |
| 2004/0150010 A1 | 8/2004 | Snider | |
| 2005/0258872 A1 | 11/2005 | Snider | |

OTHER PUBLICATIONS

Forssell, A Short Discussion on Summing Busses and Summing Amplifiers, 2001.*

Das et al., "Architectures and Simulations for Nanoprocessor Systems Integrated on the Molecular Scale", 2005.*

Huang et al., "Logic Gates and Computation from Assembled Nanowire Building Blocks", 2001, Science, vol. 294, p. 1313-1317.*

Harding et al., Evolution in Materio: Exploiting the Physics of Materials for Computation, IEEE, Dec. 2005.

Chen et al., Nanoscale molecular-switch crossbar circuits, Nanotechnology, Apr. 2003.

Hogg et al., Defect-tolerant Logic with Nanoscale Crossbar Circuits, HP Labs, May 2004.

DeHon, Array-Based Architecture for Molecular Electronics, First Workshop on Non-Silicon Computation, Mar. 2003.

Goldstein et al., Digital Logic Using Molecular Electronics, ISSCC 2002, Feb. 2002.

Huang et al., Logic Gates and Computation from Assembled Nanowire Building Blocks, Science Magazine, Nov. 2001.

Ziegler et al., The CMOS/NANO Interface from a Circuits Perspective, ISCAS '03, May 2003.

Ziegler et al., A Case for CMOS/NANO Co-design, ACM-SIGDA, Emerging Technologies Seminar, Nov. 2002.

Lee et al., CMOL Crossnets as Pattern Classifiers, IWANN, 2005.

Das et al., Architectures and Simulations for Nanoprocessor Systems Integrated on the Molecular Scale, Introducing Molecular Electronics, 2006, chap.17.

Koch, Morphware, Scientific American, Aug. 2005, pp. 56-63.

* cited by examiner

Fig.8    8x8 CROSSBAR ARRAY

| | | | | | | | | |
|---|---|---|---|---|---|---|---|---|
| 1 | 0 | 0 | 0 | 0 | 0 | 0 | 0 | — 100mV=0001 |
| 1 | 1 | 0 | 0 | 0 | 0 | 0 | 0 | — 200mV=0010 |
| 1 | 1 | 1 | 0 | 0 | 0 | 0 | 0 | — 300mV=0011 |
| 1 | 1 | 1 | 1 | 0 | 0 | 0 | 0 | — 400mV=0100 |
| 1 | 1 | 1 | 1 | 1 | 0 | 0 | 0 | — 500mV=0101 |
| 1 | 1 | 1 | 1 | 1 | 1 | 0 | 0 | — 600mV=0110 |
| 1 | 1 | 1 | 1 | 1 | 1 | 1 | 0 | — 700mV=0111 |
| 1 | 1 | 1 | 1 | 1 | 1 | 1 | 1 | — 800mV=1000 |
| 0 | 1 | 1 | 1 | 1 | 1 | 1 | 1 | — 700mV=0111 |
| 0 | 0 | 1 | 1 | 1 | 1 | 1 | 1 | — 600mV=0110 |
| 0 | 0 | 0 | 1 | 1 | 1 | 1 | 1 | — 500mV=0101 |
| 0 | 0 | 0 | 0 | 1 | 1 | 1 | 1 | — 400mV=0100 |
| 0 | 0 | 0 | 0 | 0 | 1 | 1 | 1 | — 300mV=0011 |
| 0 | 0 | 0 | 0 | 0 | 0 | 1 | 1 | — 200mV=0010 |
| 0 | 0 | 0 | 0 | 0 | 0 | 0 | 1 | — 100mV=0001 |

100mV + Vrect

Fig.10    FIRST 15x18 CROSSBAR ARRAY

| 1 | 0 | 0 | 0 | 0 | 0 | 0 | 0 | 0 | 0 | 0 | 0 | 0 | 0 | — 100mV=001 |
|---|---|---|---|---|---|---|---|---|---|---|---|---|---|---|
| 0 | 0 | 0 | 0 | 0 | 0 | 0 | 0 | 0 | 0 | 0 | 0 | 0 | 0 | — 0mV=000 |
| 0 | 1 | 1 | 0 | 0 | 0 | 0 | 0 | 0 | 0 | 0 | 0 | 0 | 0 | — 200mV=010 |
| 0 | 0 | 1 | 0 | 0 | 0 | 0 | 0 | 0 | 0 | 0 | 0 | 0 | 0 | — 100mV=001 |
| 0 | 0 | 0 | 0 | 1 | 0 | 0 | 0 | 0 | 0 | 0 | 0 | 0 | 0 | — 100mV=001 |
| 0 | 0 | 0 | 1 | 0 | 0 | 0 | 0 | 0 | 0 | 0 | 0 | 0 | 0 | — 100mV=001 |
| 0 | 0 | 0 | 0 | 1 | 1 | 1 | 0 | 0 | 0 | 0 | 0 | 0 | 0 | — 300mV=011 |
| 0 | 0 | 0 | 0 | 0 | 1 | 1 | 0 | 0 | 0 | 0 | 0 | 0 | 0 | — 200mV=010 |
| 0 | 0 | 0 | 0 | 0 | 0 | 1 | 0 | 1 | 0 | 0 | 0 | 0 | 0 | — 200mV=010 |
| 0 | 0 | 0 | 0 | 0 | 0 | 0 | 1 | 0 | 0 | 0 | 0 | 0 | 0 | — 100mV=001 |
| 0 | 0 | 0 | 0 | 0 | 0 | 0 | 1 | 1 | 1 | 1 | 0 | 0 | 0 | — 400mV=100 |
| 0 | 0 | 0 | 0 | 0 | 0 | 0 | 0 | 1 | 0 | 0 | 0 | 0 | 0 | — 100mV=001 |
| 0 | 0 | 0 | 0 | 0 | 0 | 0 | 0 | 0 | 1 | 0 | 1 | 0 | 0 | — 200mV=010 |
| 0 | 0 | 0 | 0 | 0 | 0 | 0 | 0 | 0 | 0 | 1 | 1 | 0 | 0 | — 200mV=010 |
| 0 | 0 | 0 | 0 | 0 | 0 | 0 | 0 | 0 | 0 | 0 | 0 | 1 | 1 | — 200mV=010 |
| 0 | 0 | 0 | 0 | 0 | 0 | 0 | 0 | 0 | 0 | 0 | 0 | 0 | 0 | — 0mV=000 |
| 0 | 0 | 0 | 0 | 0 | 0 | 0 | 0 | 0 | 0 | 0 | 0 | 0 | 0 | — 0mV=000 |
| 0 | 0 | 0 | 0 | 0 | 0 | 0 | 0 | 0 | 0 | 0 | 0 | 0 | 0 | — 0mV=000 |

100mV + Vrect

Fig.11  SECOND 15x18 CROSSBAR ARRAY

| 1 | 0 | 0 | 0 | 0 | 0 | 0 | 0 | 0 | 0 | 0 | 0 | 0 | 0 | — 100mV=01 |
|---|---|---|---|---|---|---|---|---|---|---|---|---|---|---|
| 0 | 0 | 0 | 0 | 0 | 0 | 0 | 0 | 0 | 0 | 0 | 0 | 0 | 0 | — 0mV=00 |
| 0 | 0 | 0 | 0 | 0 | 0 | 0 | 0 | 0 | 0 | 0 | 0 | 0 | 0 | — 0mV=00 |
| 0 | 0 | 1 | 1 | 0 | 0 | 0 | 0 | 0 | 0 | 0 | 0 | 0 | 0 | — 200mV=10 |
| 0 | 0 | 0 | 0 | 1 | 0 | 0 | 0 | 0 | 0 | 0 | 0 | 0 | 0 | — 100mV=01 |
| 0 | 0 | 0 | 0 | 0 | 1 | 0 | 0 | 0 | 0 | 0 | 0 | 0 | 0 | — 100mV=01 |
| 0 | 0 | 0 | 0 | 0 | 0 | 1 | 0 | 0 | 0 | 0 | 0 | 0 | 0 | — 100mV=01 |
| 0 | 0 | 0 | 0 | 0 | 0 | 1 | 0 | 0 | 0 | 0 | 0 | 0 | 0 | — 100mV=01 |
| 0 | 0 | 0 | 0 | 0 | 0 | 0 | 1 | 0 | 0 | 0 | 0 | 0 | 0 | — 100mV=01 |
| 0 | 0 | 0 | 0 | 0 | 0 | 0 | 0 | 1 | 1 | 0 | 0 | 0 | 0 | — 200mV=10 |
| 0 | 0 | 0 | 0 | 0 | 0 | 0 | 0 | 0 | 0 | 0 | 0 | 0 | 0 | — 0mV=00 |
| 0 | 0 | 0 | 0 | 0 | 0 | 0 | 0 | 0 | 0 | 1 | 0 | 0 | 0 | — 100mV=01 |
| 0 | 0 | 0 | 0 | 0 | 0 | 0 | 0 | 0 | 1 | 0 | 0 | 0 | 0 | — 100mV=01 |
| 0 | 0 | 0 | 0 | 0 | 0 | 0 | 0 | 0 | 0 | 0 | 1 | 0 | 0 | — 100mV=01 |
| 0 | 0 | 0 | 0 | 0 | 0 | 0 | 0 | 0 | 0 | 0 | 0 | 1 | 0 | — 100mV=01 |
| 0 | 0 | 0 | 0 | 0 | 0 | 0 | 0 | 0 | 0 | 0 | 0 | 0 | 1 | — 100mV=01 |
| 0 | 0 | 0 | 0 | 0 | 0 | 0 | 0 | 0 | 0 | 0 | 0 | 0 | 0 | — 0mV=00 |
| 0 | 0 | 0 | 0 | 0 | 0 | 0 | 0 | 0 | 0 | 0 | 0 | 0 | 0 | — 0mV=00 |
| 0 | 0 | 0 | 0 | 0 | 0 | 0 | 0 | 0 | 0 | 0 | 0 | 0 | 0 | — 0mV=00 |

100mV + Vrect

1st 253x253 Crossbar Array

2nd 253x253 Crossbar Array

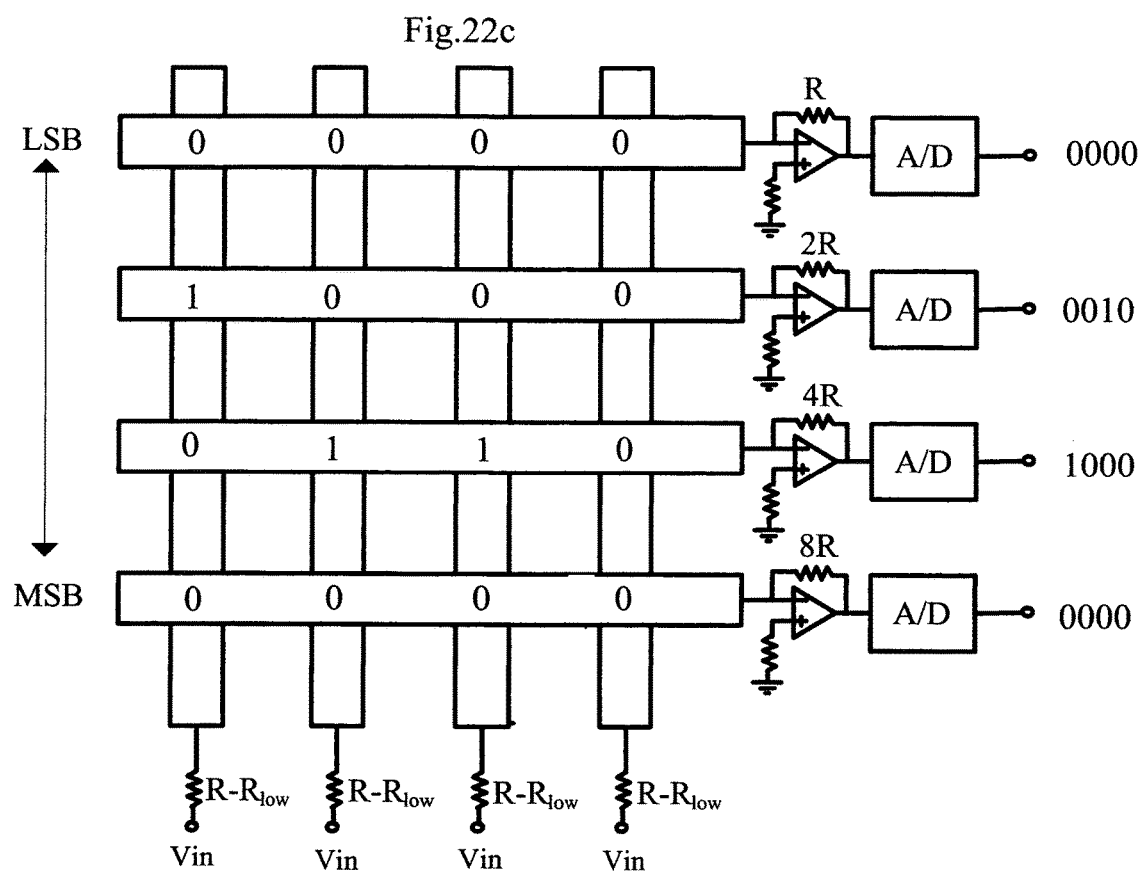

CROSSBAR ARITHMETIC AND SUMMATION PROCESSOR

This patent application is a Continuation-In-Part of U.S. patent application Ser. No. 11/395,232, filed Apr. 3, 2006.

FIELD OF THE INVENTION

The present invention pertains to a processor designed for arithmetic and summation processes.

BACKGROUND OF THE INVENTION

Crossbar interconnect technology has been developed in recent years with a primary focus in applications in information storage and retrieval. A crossbar array basically comprises a first set of conductive parallel wires and a second set of conductive parallel wires formed so as to intersect the first set of conductive wires. The intersections between the two sets of wires are separated by a thin film material or molecular component. A property of the material, such as the material's resistance, may be altered by controlling the voltages applied between individual wires from the first and second set of wires. Alteration of the materials resistance at an intersection may be performed so as to achieve a high resistance or low resistance state and thus store digital data. It is noted that crossbar arrays are occasionally referred to as cross point or crosswire arrays.

Nagasubramanian et al. U.S. Pat. No. 5,272,359 discloses such a crossbar array employing an organic conducting polymer as the material. Resistance variation from $10^{12}$ ohms to $10^{7}$ ohms is reported to be achieved by applying a 10V pulse with a 100 ms duration. Nagasubramanian et al. discusses the uses of the crossbar array as forming a memory matrix for an artificial neural net.

Other materials useful for electrically programmable resistance are those with a perovskite structure such as magnetoresistive materials (U.S. Pat. Nos. 6,531,371 and 6,693,821), a variety of organic semiconductors (U.S. Pat. Nos. 6,746,971 and 6,960,783), and silver-selenide/chalcogenide laminate films (U.S. Pat. No. 6,867,996).

Kuekes et al. U.S. Pat. No. 6,128,214 uses crossbars applicable at nanometer scales by employing molecular components as a bridging component between the wires. Such nanoscale crossbars have been disclosed as useful tools in molecular electronics capable of performing a variety of tasks including signal routing, multiplexing, and performing simple logic functions in U.S. Pat. Nos. 6,256,767, 6,314,019, 6,518,156, 6,586,965, 6,781,166, 6,812,117, 6,854,092, 6,858,162, 6,870,394, 6,880,146, 6,898,098, 6,900,479, 6,919,740, 6,963,077, and U.S. Patent Application 2005/0258872. Molecular crossbar arrays used in neural networks is disclosed in U.S. Patent Application 2004/0150010. Manufacturing of molecular crossbar arrays is taught in U.S. Pat. Nos. 6,248,674, 6,432,740, 6,835,575, 6,846,682, and 6,998,333.

Examples of non-patent literature concerned with molecular crossbar arrays include Ziegler et al. "A Case for CMOS/nano Co-design," Lee et al. "CMOL Crossnets as Pattern Classifiers," and Das et al. "Architectures and Simulations for Nanoprocessor Systems Integrated On the Molecular Scale." Reinhold Koch provides a discussion of programmable crossbar arrays formed from ferroelectric material in Scientific American Vol. 293, No. 2 pgs. 56-63.

While there has been some development in using crossbar topology to replicate the functions of the basic logical units (AND, OR, NAND, etc.) as used in conventional arithmetic logic units, the present invention takes a different approach to using crossbar arrays in arithmetic processing which may provide a new level of computational power beyond conventional arithmetic processors.

SUMMARY OF THE INVENTION

The present invention combines a crossbar array with a programming unit, an input unit, and a post-processing unit so as to form a crossbar arithmetic processor. The crossbar array is preferably modified to include rectification layers that control the current flow direction between layers of the crossbar array. The programming unit sets the conductive states of the crossbar so as to store bit patterns representative of programmed numerical values in each of the columns of the crossbar array. The input unit provides another bit pattern representative of an input numerical value to the columns of the crossbar array. A post-processing unit converts analog signals output from each of the rows of the crossbar array into digital output bit patterns. Circuitry is provided to combine the digital output bit patterns into an output numerical value representative of an arithmetic sum or an arithmetic product based upon the programmed and input numerical values.

BRIEF DESCRIPTION OF THE DRAWINGS

FIG. 8 illustrates an 8×15 crossbar array loaded with data in a form useful for multiplication of a multiplicand by a multiplier.

FIG. 10 illustrates the operation of a $1^{st}$ 15×18 crossbar array performing crossbar arithmetic.

FIG. 11 illustrates the operation of a $2^{nd}$ 15×18 crossbar array performing crossbar arithmetic.

FIGS. 22a-22d illustrates an alternative embodiment of the invention including weighted feedback resistors associated with op-amps.

DETAILED DESCRIPTION

I. Basic Outline of Crossbar Arithmetic Processor

Figure 1:
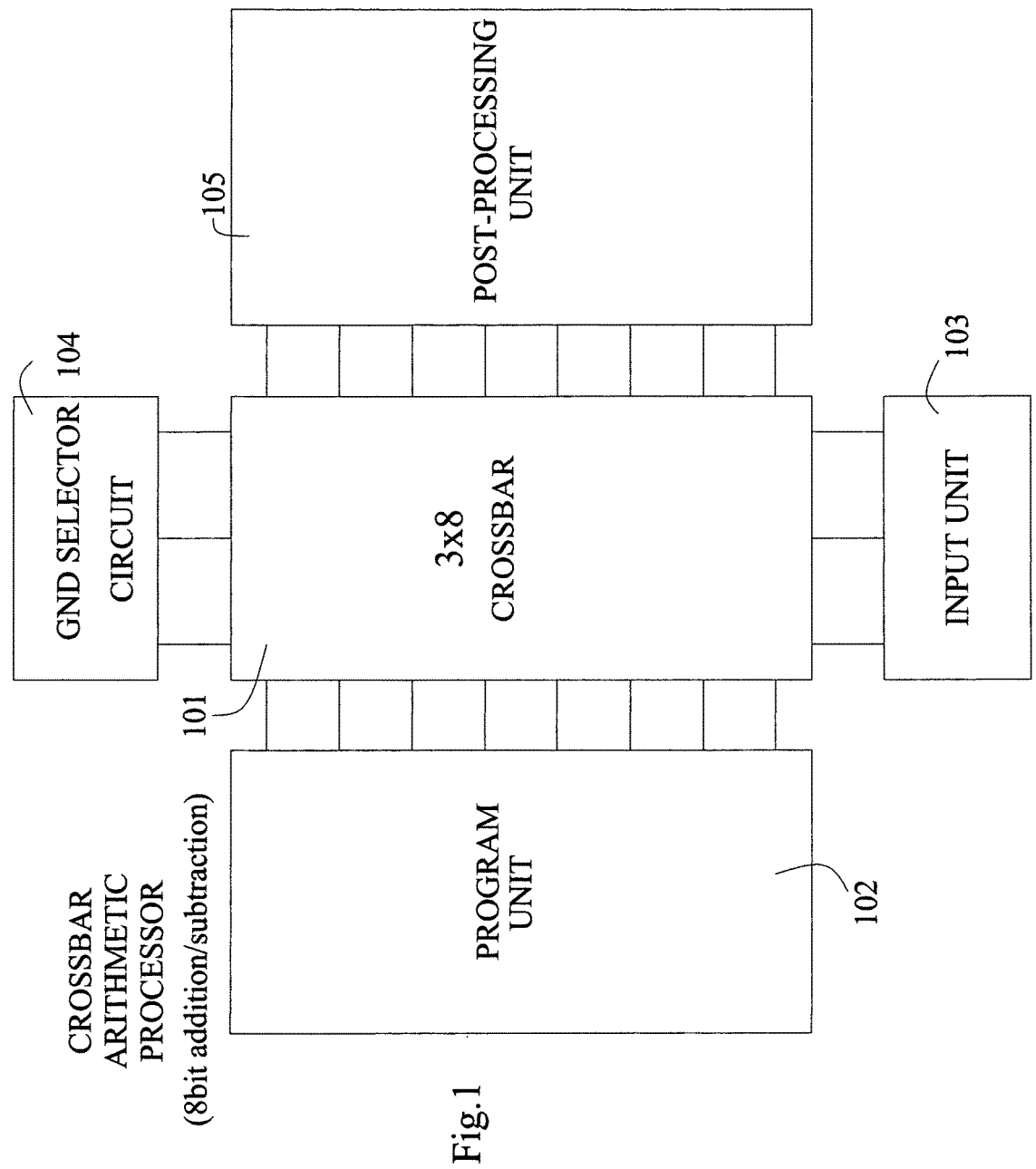
FIG. 1 illustrates the basic components of one embodiment of a crossbar arithmetic processor.

FIG. 1 illustrates the basic components of one embodiment of a crossbar arithmetic processor. In this example, a 3×8 crossbar 101 is used with an input unit 103, providing a three bit input, program unit 102, and ground selector circuit 104, provided to program the resistance states within the crosspoints (i.e. intersection points) of the crossbar array, and a post-processing unit 105, provided to convert the analog output voltages produced by the crossbar array into a binary form representative of a numerical value.

Figure 2A:
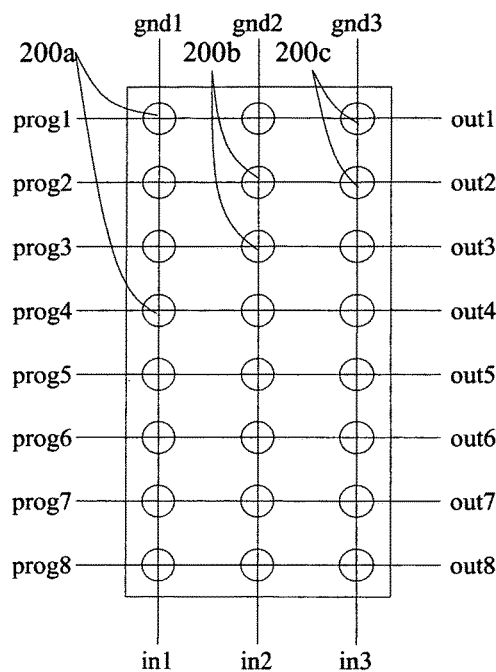
FIGS. 2a-2c illustrates the internal structure of a crossbar array used in accordance with the present invention.
Figure 2B:
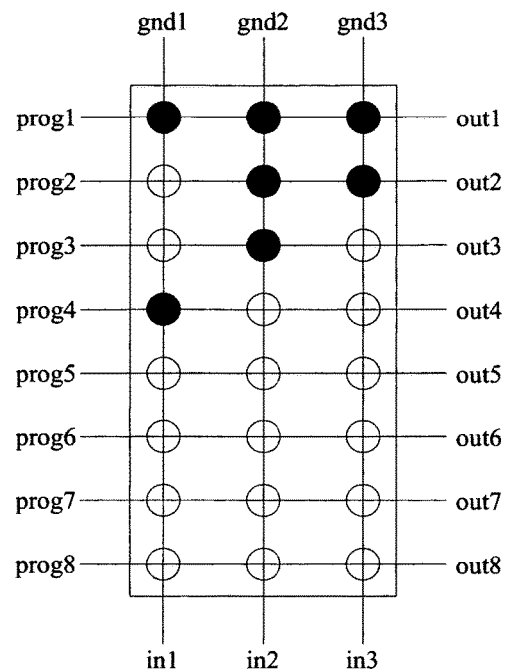
Figure 2C:
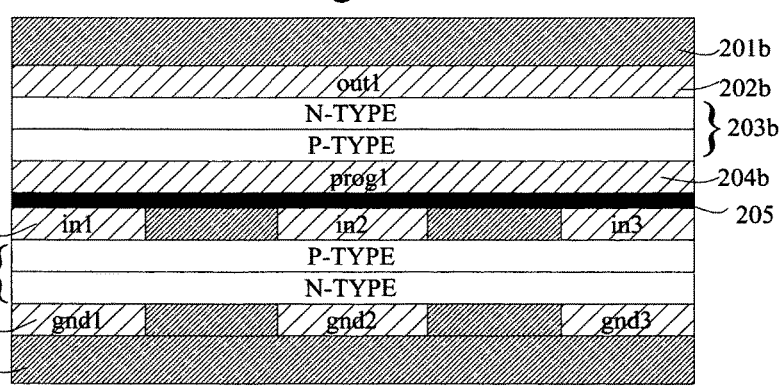

FIGS. 2a-2c illustrates the internal workings of a crossbar array used in accordance with the present invention. As illustrated in FIG. 2a, a 3×8 crossbar array includes three parallel input wires, 8 parallel output wires, 8 parallel programming wires, and 3 parallel ground connection wires. The output wires are formed so as to intersect the input wires at 24 (8×3) crosspoints. Between the input wires and output wires a material 205 with programmable resistance is formed and the state of resistance of a particular crosspoint determines if high or low conduction will occur between the associated input wire and output wire at this point. Similarly, the programming wires and ground connection wires are formed so as to intersect and are used to set the initial resistance states of the 24 crosspoints. It is noted that the circuit formed via the input wires and the output wires is preferably operated at separate times from the circuit formed by the programming and ground connection wires. In addition, these circuits are preferably electrically isolated by providing different grounds and driving sources so as to minimize any possible electrical interference.

One possible cross-sectional structure of the crossbar array is illustrated in FIG. 2c. As shown, two anti-symmetrical crossbar sections a,b are formed each comprising corresponding insulating support substrates 201a, 201b, first arrays of parallel conductive wires 202a, 202b, rectification layers 203a, 203b (shown as a pn junction for exemplary purposes but with other rectification materials or rectifying molecular junctions being equivalent), and second arrays of parallel conductive wires 204a, 204b respectively formed parallel to wires 202a, 202b. The purpose of rectification layer 203a is to allow current flow from programming wires 204b to ground wires 202a and to disallow current flow in the opposite direction. Similarly, the purpose of rectification layer 203b is to allow current flow from input wires 204a to output wires 202b and to disallow current flow in the opposite direction. To avoid crosstalk between adjacent wires, the rectification layers 203a, 203b should be formed so as to have relatively high resistance in the area between the adjacent wires. This may be accomplished by regulation of the doping concentration if a pn junction type rectification layer is used, or by making the rectification layers sufficiently thin relative to the interwire spacing, or by using an anisotropic material or molecular film that only conducts in a single direction within the layers 203a, 203b.

The two sections a and b may be made integrally via micro or nanofabrication procedures or made separately and combined so as to sandwich a programmable material or molecular film 205. Layer 205 is preferably initially formed so as to be at a high resistance state and is preferably formed so as to be anisotropic or sufficiently thin relative to the wire interspacing distance so as to avoid leakage current or crosstalk between adjacent wires. To further avoid such leakage current, anisotropic material layers exhibiting high conductivity in the direction perpendicular to the plane formed by layer 205, but exhibiting low conductivity in the direction parallel to the plane formed by layer 205, may be added above and below layer 205. Also, instead of continuous layers, layers 203a, 203b, and 205 may be segmented into electrically isolated portions, each portion associated with one of the intersection point of the crossbars. Other embodiments for the crossbar array are discussed in relation to FIGS. 20a, 20b, 21a, and 21b.

The net effect of this configuration is to enable the generation of a physical matrix transformation Vout(j)=ΣT(i,j) Vin(i) summed over all i, where Vin(i) corresponds to the voltages input to the crossbar via the input lines, T(i,j) correspond to transfer values related to the programmed resistances, and Vout(j) corresponds to the voltage outputs via the output lines. U.S. Pat. No. 7,302,513 entitled "Programmable Crossbar Signal Processor", which is incorporated by reference in its entirety, contains further information regarding this and other programmable crossbar array structures.

Programming of the resistance values of particular crosspoints is performed by setting a ground connection of a particular column of the crosspoint array to ground and setting the remaining ground connections to a high resistance state. The data intended to be programmed into the particular column of the crossbar is input via the programming wires using voltages above a threshold voltage necessary to alter the resistance state at the crosspoints. FIG. 2a indicates various crosspoints 200a, 200b, 200c associated with respective columns and FIG. 2b indicates the conductivity states at the crosspoints after programming. This is equivalent to storing binary values 00001001, 00000111, and 00000011 which, in the base 10 number system, equates to numerals 9, 7, and 3.

Figure 3:
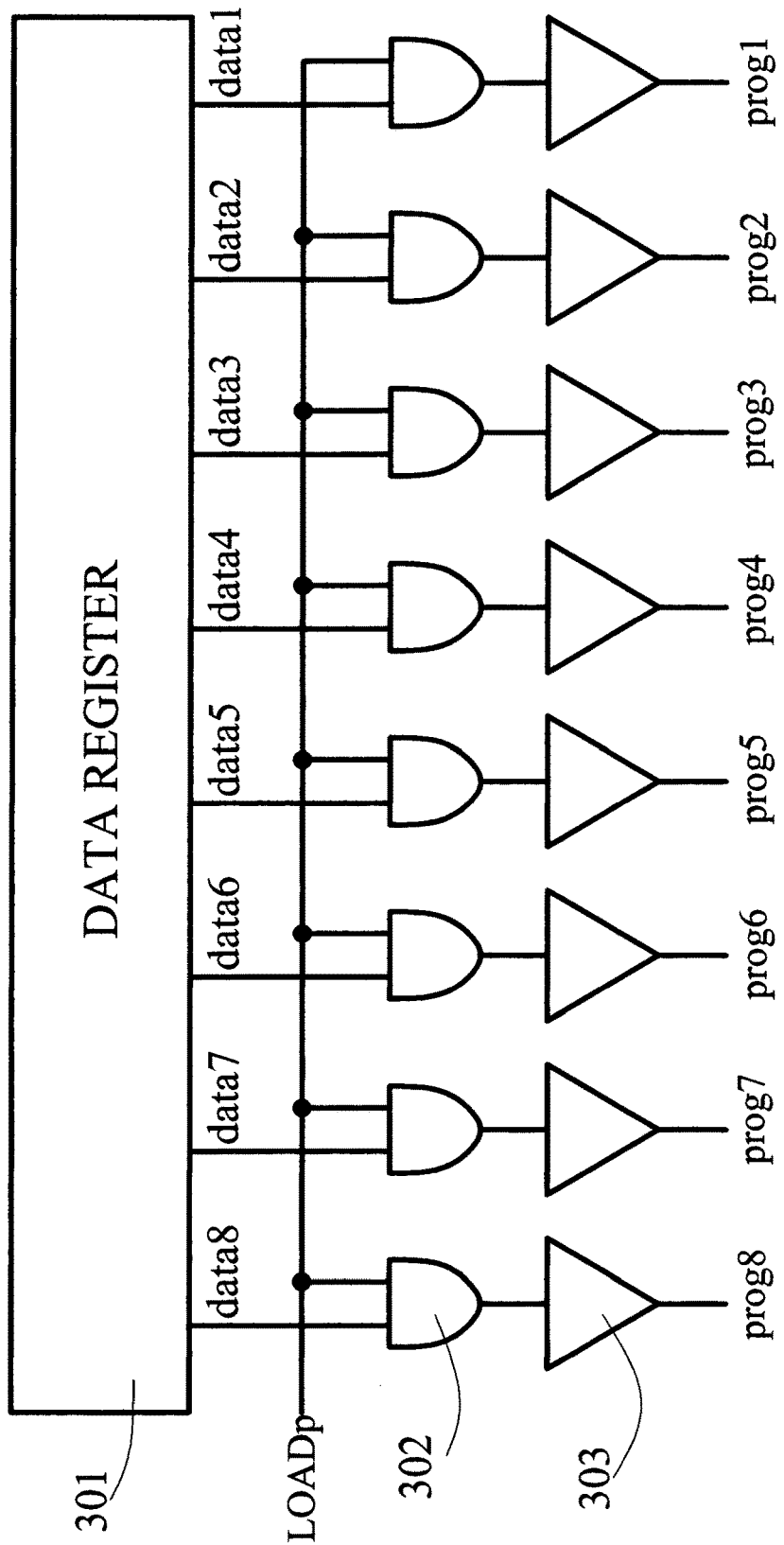
FIG. 3 illustrates an example of a program unit used in a crossbar arithmetic processor.

FIG. 3 illustrates an example of program unit 102. Data register 301, such as a shift register, provides binary data received from a data storage register or generated based on pressing a particular button in a numeric keypad, keyboard, or other input device. An array of AND gates 302 regulates the load timing of data1-data8 via a LOADp signal which may be generated by a microprocessor. An array of voltage converters 303 transform the voltage signal from the levels associated with the particular logic circuitry used to levels necessary to alter the resistance of the particular programmable material used in the crossbar array.

Figure 4:
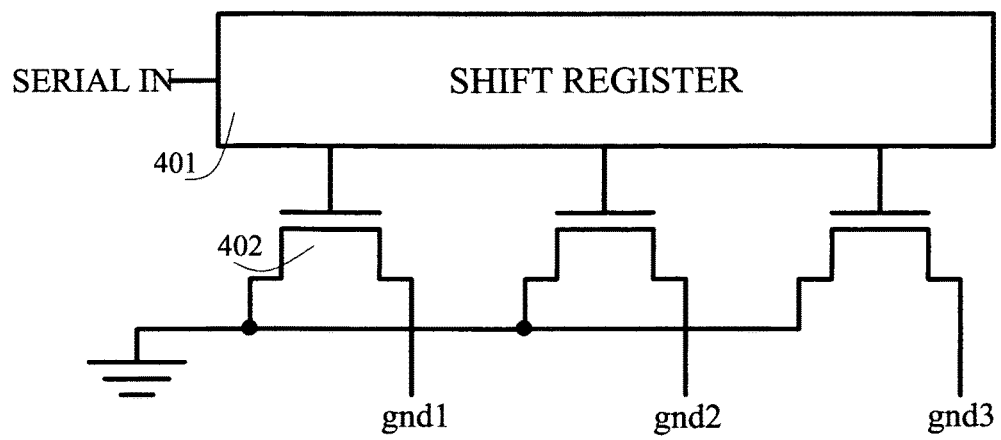
FIG. 4 illustrates an example of ground selector circuit used in a crossbar arithmetic processor.

FIG. 4 illustrates an example of ground selector circuit 104. A serial in/parallel out shift register 401 is shown as one possible means for sequentially actuating each ground connections by shifting a single logic 1 value along the register. Alternatively, each ground connection may be independently controlled to allow programming of the columns in an arbitrary order. Transistors 402 are provided so as to set ground connections when the control input is a logic 1 value and set a high resistance state when the control input is a logic 0.

Figure 5:
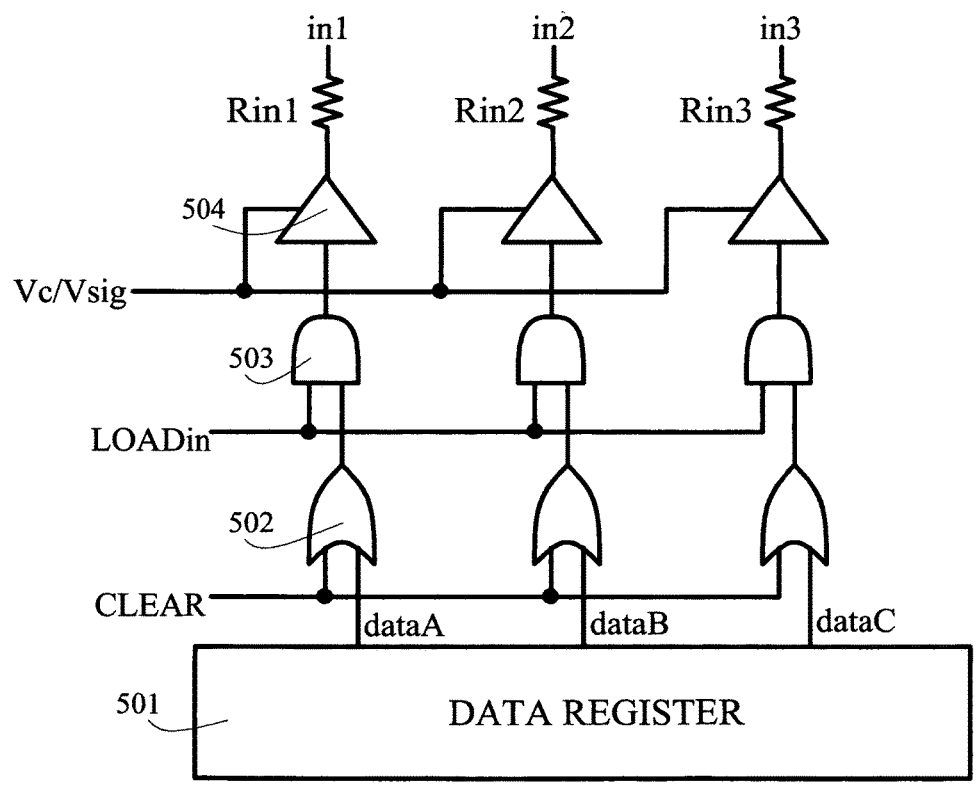
FIG. 5 illustrates an example of an input unit used in a crossbar arithmetic processor.

FIG. 5 illustrates an example of input unit 103. Data register 501, such as a shift register, provides binary data received from a data storage register or generated based on pressing a particular button in a numeric keypad, keyboard, or other input device. An array of OR gates 502 are used to transmit the input dataA-dataC or a CLEAR signal to the input wires of the crossbar array. An array of AND gates 503 regulates the load timing via the LOADin signal. Voltage alteration circuitry 504 is provided to transform the logic signal voltages to voltages suitable for input to the crossbar without modifying the resistance state of any crosspoints. Individual columns may be cleared by setting a selected column to a resistance modifying voltage rather than a non-modifying voltage (typically higher in magnitude). However, if it is desired to clear the contents of the entire crossbar array (i.e. return all of the crosspoints in all of the columns to a high resistance state), the CLEAR signal may be set to 1 and a control signal Vc/Vsig may be provided to switch between a clearing voltage Vc, which is greater than the voltage necessary to modify the resistance, and a signal voltage Vsig, which is less than the voltage necessary to modify the resistance.

Figure 6:
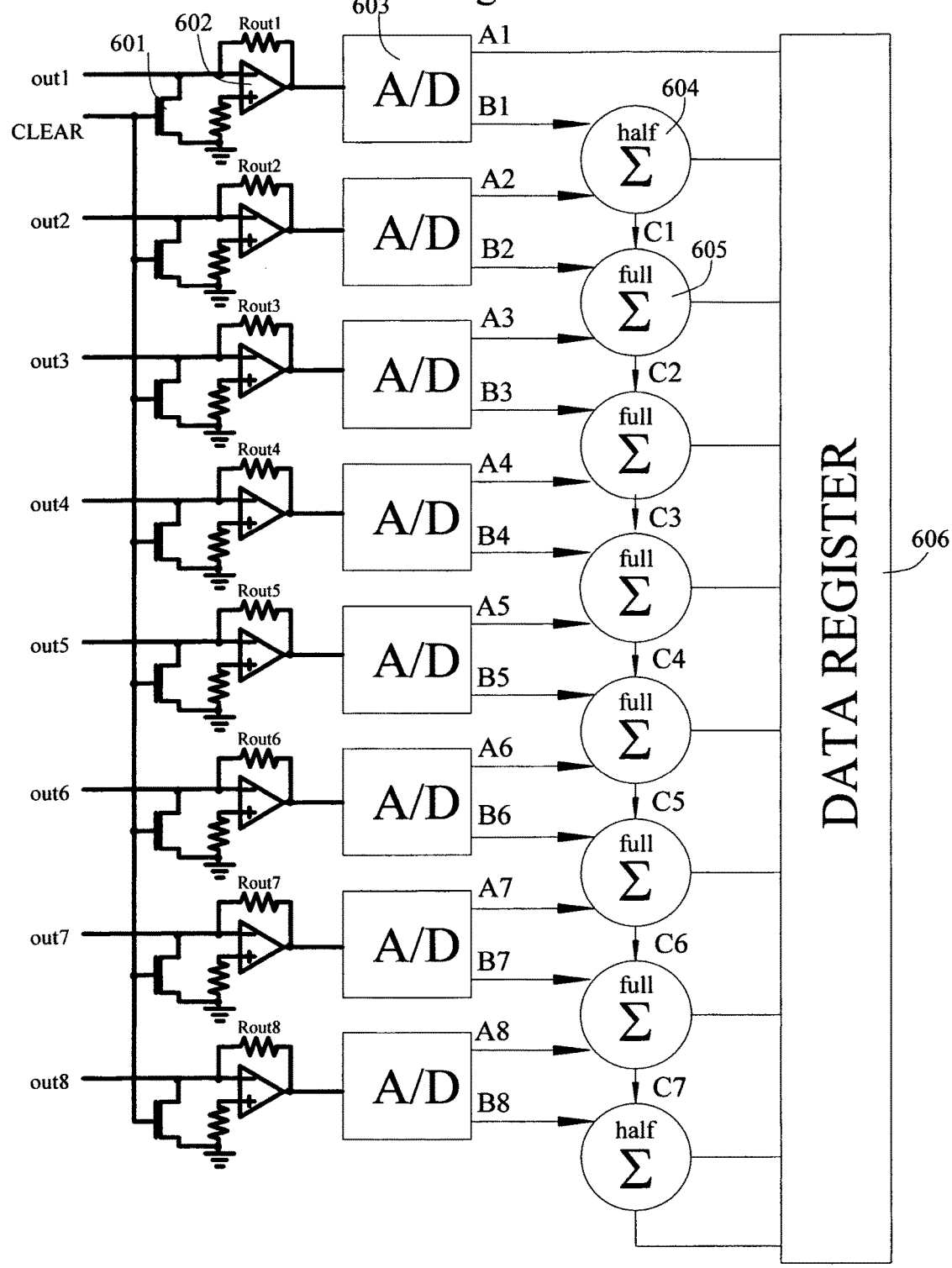
FIG. 6 illustrates an example of a post-processing unit used in a crossbar arithmetic processor.

FIG. 6 illustrates an example of post-processing unit 105. An array of inverting op-amps 602 are connected to the output wires of the crossbar array along with an array of transistors 601 designed to short the output lines of the crossbar to ground when a CLEAR signal is set high. When the resistance values of all of the crosspoints in the crossbar array are desired to be set back to a high resistance state (i.e. all logic zero), the amplification circuitry 504 is set to apply a modification voltage Vp and the CLEAR signal sets all of the input lines to a high value and all of the output values to GND.

However, when the crosspoints of the crossbar are loaded with data and the CLEAR signal is set to zero, the overall effect of the op-amp is to behave as an inverting summing amplifier for each particular row of the crossbar array. The overall transfer characteristic may be expressed as $$Vout(j)=-\Sigma Rout(j)/[Rin(i)+Rij+Rp(i,j)]\times[Vin(i)-Vrect], \text{ the summation performed for } 1\leq i\leq 3, \quad (Eq1)$$

where Vout(j) are the respective voltage values contained in the output rows (after the op-amps but before the A/D converters), Vin(i) are the respective values contained in the input rows (prior to the input resistances), Rout(j) are the feedback resistances used in the array of op-amps 602, Rin(i) are the input resistances in the input circuit of FIG. 5, Rij are the programmed resistance values of the crosspoints, Rp(i,j) account for parasitic resistances contained in the wiring, which depends on the relative location of a particular crosspoint with respect to the input and output circuits, and Vrect accounts for the voltage drop across the rectification layer 203*b*.

If the input and output wires of the crossbar are uniformly spaced within the columns and rows, the parasitic resistances Rp(i,j) may be expressed as $$Rp(i,j)=[(N-i)+(M-j)]Rp(0)+Rp,res, \quad (Eq2)$$

where Rp(0) is the line resistance between two adjacent crosspoints, N is the total number of columns of wires, M is the total number of rows of wires, and Rp,res represents residual parasitic impedance resulting from connection wiring between the crossbar array and the input and output circuits. Choosing values of Rin(i) such that Rin(i)=Rin'−(N−i)Rp(0)−Rp,res, where Rin' is a common value independent of i, and setting Vin(i)=Vin'(i)+Vrect helps reduce Eq1 to $$Vout(j)=-\Sigma Rout(j)/[Rin'+Rij+(M-j)Rp(0)]\times[Vin'(i)], \text{ the summation performed for } 1\leq i\leq 3. \quad (Eq3)$$

Choosing values of Rout(j) such that Rout(j)=Rin'+(M−j)Rp(0) further reduces Eq3 to $$Vout(j)=-\Sigma[1/(1+Rij/(Rin'+(M-j)Rp(0)))]\times[Vin'(i)], \text{ the summation performed for } 1\leq i\leq 3. \quad (Eq4)$$

Given a specific programmable material the maximum resistance may be several times larger to several thousands of times larger than the minimum resistance. Selecting the resistance value Rin' to a value intermediate to the high and low resistance range of a particular programmable material and assuming the column parasitic resistances are relatively small assures that when Rij is a low resistance value [1/(1+Rij/(Rin'+(M−j)Rp(0)))]=1 and when Rij is a high resistance value [1/(1+Rij/(Rin'+(M−j)Rp(0)))]=0. Thus, for a particular crossbar array, a transfer function relationship between the input voltage vector and output voltage vector may be expressed as $$Vout(j)=-\Sigma T(i,j)\times[Vin'(i)], \text{ the summation performed for } 1\leq i\leq 3, \quad (Eq5)$$

where any particular T(i,j) value is 1 for a low resistance crosspoint and 0 for a high resistance crosspoint.

Continuing with the description of FIG. 6, analog to digital (A/D) conversion circuitry 603 is provided, which may include inverting circuitry such as an inverting op-amp to change the values Vout(j) to positive values. Given that the particular crossbar array under consideration contains only three columns, and supposing a logic high value of Vin'(i)=1V and a logic low value of Vin'(i)=0V, the possible output value of any row would be 0V, 1 V, 2V, or 3V. A two bit A/D converter would provide digital outputs of 00, 01, 10, or 11 depending upon the analog output value. The outputs in FIG. 6 are respectively indicated as Aj, Bj where 1≤j≤8. An array of full adder circuits 605 with half-adder circuits 604 associated with the uppermost and lowermost row are provided to convert the 2 bit binary data produced by the A/D converters into a resultant binary value. The carry values of the half and full adders are indicated as Cj where 1≤j≤8. The output values of the half and full adders are stored in data register 606 or sent to a storage register, display device, printer, or other output mechanism suitable to receive binary data.

The following sections will explain how the basic circuit configurations of FIGS. 1-6 may be used in performing addition, subtraction, multiplication, division, and other numerical calculation processes.

II. Addition/Subtraction

Figure 7:
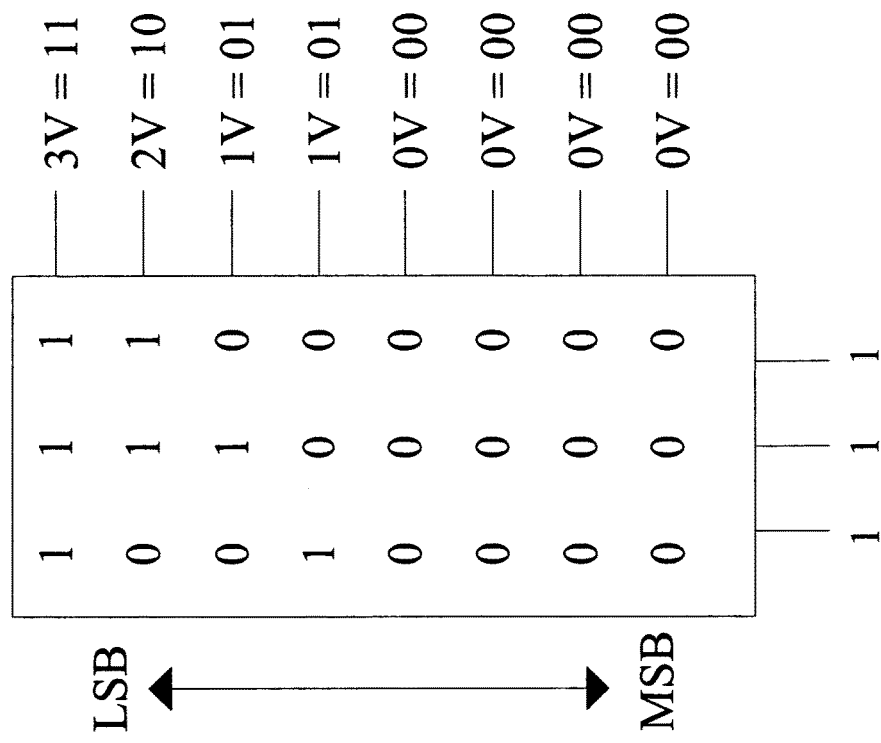
FIG. 7 illustrates the use of a 3×8 crossbar arithmetic processor in adding the binary values 00001001, 00000111, and 00000011.

FIG. 7 illustrates the use of a 3×8 crossbar arithmetic processor in adding the binary values 00001001, 00000111, and 00000011. In this case the first row is used for the least significant bit (LSB) and the fourth row for the most significant bit (MSB). Selected crosspoints of the crossbar array are initially programmed, as earlier explained, with low resistance values corresponding to logic 1. If all three of these numbers are desired to be added together then the input wires should all be set to a logical high value such as 1V. The analog output produced for the respective rows is then 3V, 2V, 1V, and 1V with the remaining row outputs being 0V. Analog to digital conversion transforms these values to 11, 10, 01, and 01. The array of half-adders and full adders then generates the following arithmetic process $$\begin{array}{r} 000000\underline{11} \\ 00000\underline{10} \\ 0000\underline{01} \\ 000\underline{01} \\ \hline 00010011 \end{array}$$

which is the expected result (1001+0111+0011=9+7+3, 00010011=19).

By using crossbar arrays with a larger number of rows, and providing larger arrays for the circuit elements in the programming and post-processing circuits, larger numerical values (i.e. 16 bit, 32 bit, 128 bit) may be added at no cost in processing time. A preliminary conversion of one of the input bit patterns to 2's complement form would allow for subtraction as well. A key limitation to the preceding configuration is that the crossbar size is limited to three columns since 2-bit A/D converters can only discriminate among four voltage levels. Using higher resolution A/D converters does not solve this problem because there would then be too many inputs for simple half adders and full adders to handle and convert to a useful result (although conceivably more complex circuitry may be employed for such purposes). One way crossbar arithmetic may be applied to summing a large set of binary numbers as well as to multiplication processes is by cascading a plurality of crossbar arithmetic processors as described in the following section.

III. Multiplication/Integration

FIG. 8 illustrates an 8×15 crossbar array loaded with data in a form useful for multiplication of a multiplicand (in this case 11111111) by a multiplier. The associated ground circuit and input circuit are substantially the same as in FIGS. 4 and 5 except for incorporating additional duplicate circuit elements so as to address eight rather than three columns of the crossbar. The associated programming circuit is the same as in FIG. 2 except for incorporating additional duplicate circuit elements so as to address 15 rather than 8 rows of the crossbar and preferably using a serial-in/parallel-out shift register as data register 301. The multiplicand (11111111 as illustrated in FIG. 8) may thus be programmed in shifted increments within each column by sequential 1 bit shifts of the shift register 301 followed by a loading step (LOADp=1) after each shifting step. In this case, a shift register may be used as data register 401 to shift a singular bit that sequentially actuates consecutive ground connections so as to program consecutive columns of the crossbar array until all of the columns are programmed. For exemplary purposes the multiplier input of FIG. 8 is set to a 11111111 binary value by setting all of the input wires to a voltage of 100 mV+Vrect, where 100 mV would be equivalent to a logic 1 and Vrect accounts for the voltage drop across the rectification layer of the crossbar array.

Figure 9A:
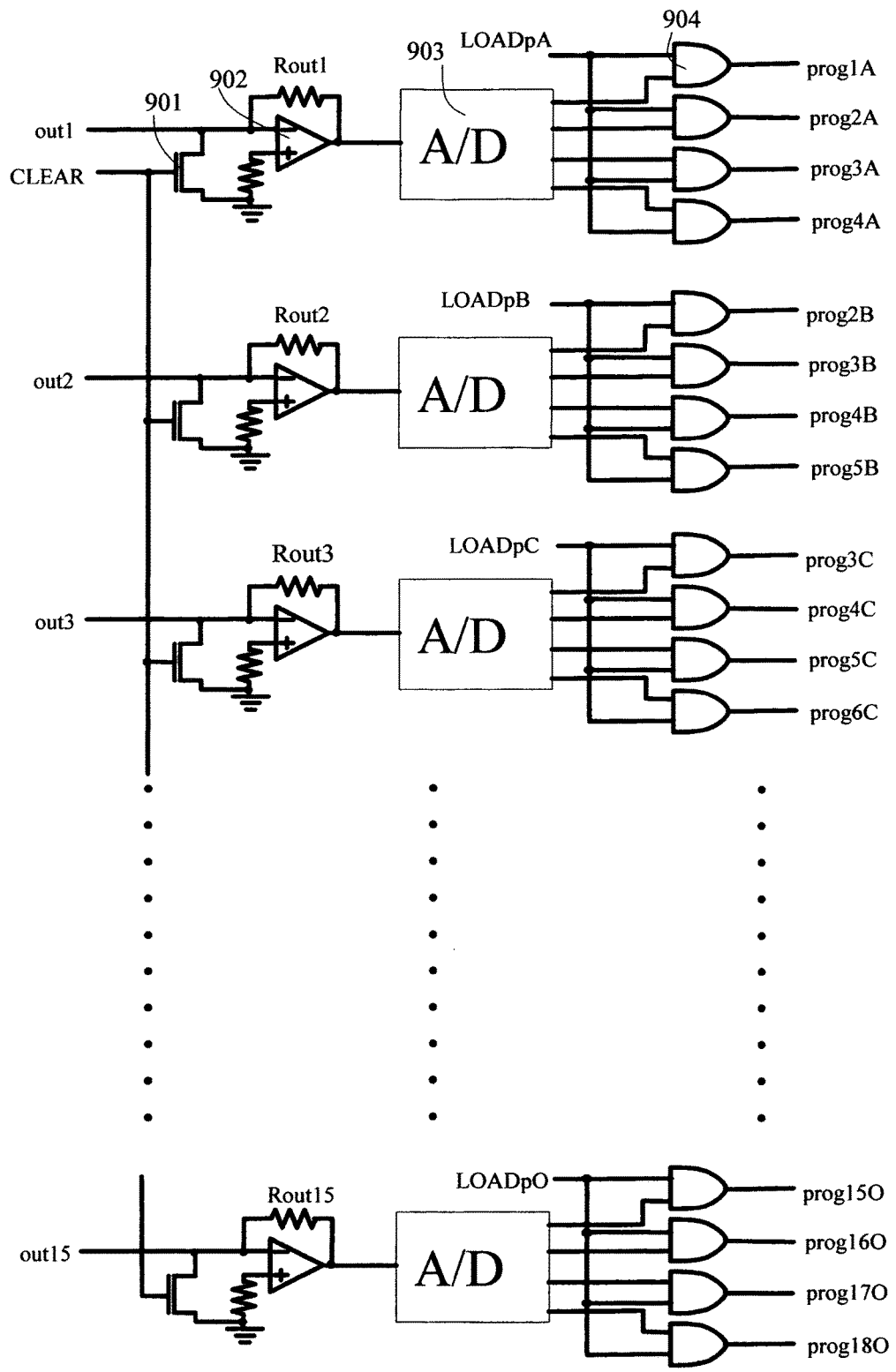
FIGS. 9a and 9b illustrates an interface circuit configuration used to connect an 8×15 crossbar array such as in FIG. 8 with a 15×18 crossbar array.
Figure 9B:
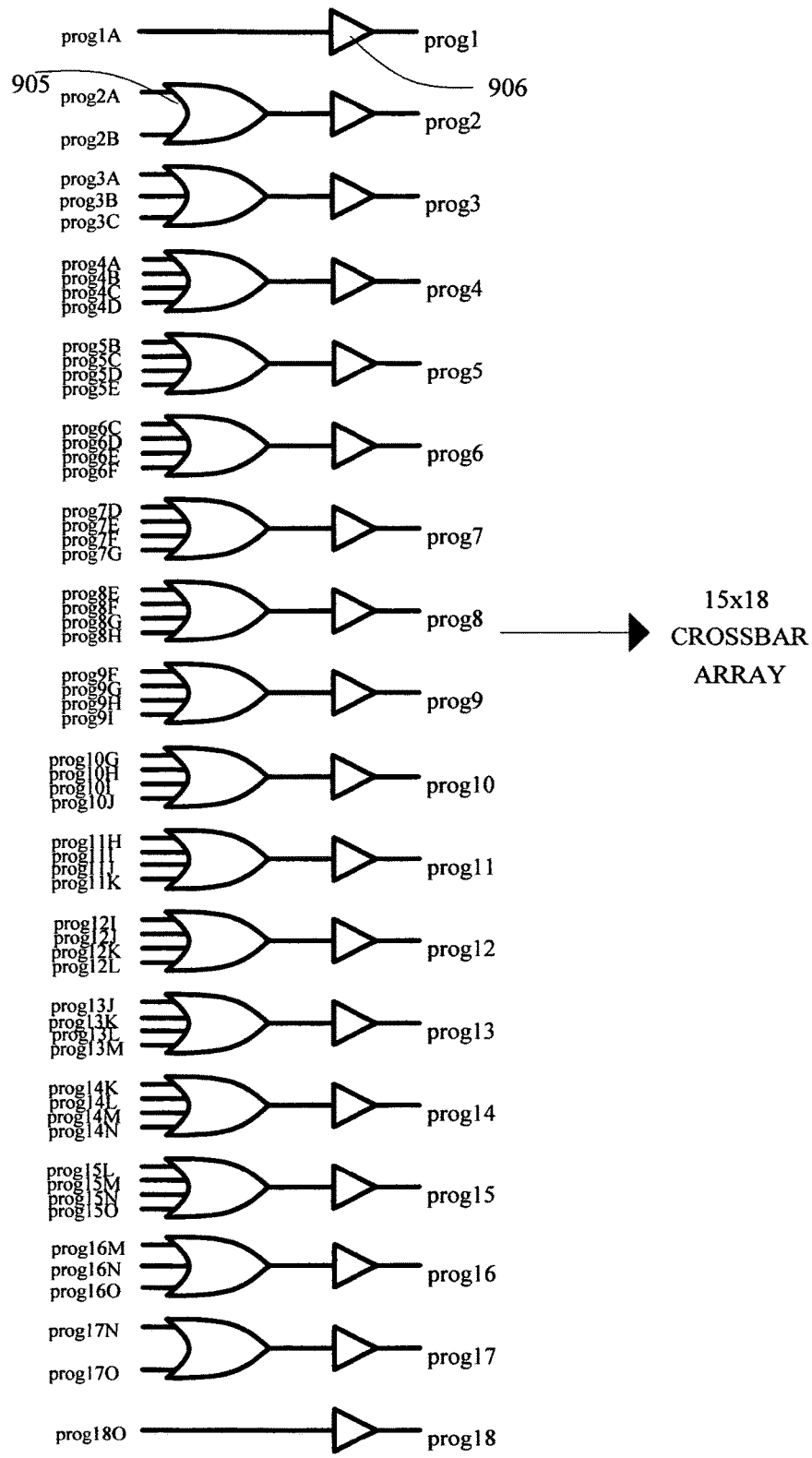

FIGS. 9a and 9b illustrates an interface circuit configuration used to connect an 8×15 crossbar array such as in FIG. 8 with a 15×18 crossbar array. As in the post-processing circuit of FIG. 6, transistors 901 are provided to facilitate clearing of the 8×15 crossbar array and op-amps 902 facilitate the summing action of the voltage states for each row. However, in this case four bit A/D converters 903 are used since 9 possible analog values are possible at the input. Given the nature of the multiplication process in which data sums on the upper and lower rows are relatively low, whereas data sums toward the middle row are high, alternative circuit construction may use a 1-bit A/D converter for the first and fifteenth rows, a 2-bit A/D converter for the second, third, thirteenth, and fourteenth rows, a 3-bit A/D converter for the fourth-seventh and ninth-twelfth rows and a 4-bit A/D converter for the eighth row, which may beneficially result from less circuit complexity. However, using a common A/D converter resolution allows the possibility of applications in summing and integration processes, in which the data quantity is not weighted toward the middle rows. Logic AND gates 904 are used to control the load timing of each of the outputs of the A/D circuits into a column of the 15×18 crossbar array. Signal LOADpA provides loading of the first column of the 15×18 crossbar array with data prog1A-prog4A, signal LOADpB provides loading of the second column of the 15×18 crossbar array with data prog2B-prog5B, signal LOADpC provides loading of the third column of the 15×18 crossbar array with data prog3C-prog6C, etc., up to signal LOADpO which loads the last column with data prog15O-prog18O. Logic OR gates 905 in FIG. 9b determine the relative position of the four bit data within a particular column and voltage transformation circuitry 906 transforms the voltage values from a logic HIGH magnitude to a sufficient drive voltage so as to alter the programmable material resistance within the selected crosspoints of the crossbar array. Signals prog1-prog18 thus set the crosspoint resistance state for a selected column of the 15×18 crossbar array. It is noted that instead of using the AND and OR gate arrays the outputs from the A/D converters 903 may be temporarily stored in respective addresses of a data register and recalled when programming the columns of the 15×18 crossbar array.

The data values shown stored in the crossbar array of FIG. 10 are indicative of the results obtained in the present example wherein the multiplicand is 11111111 and the multiplier is 11111111. Applying an input of 100 mV+Vrect to the input line of the 15×18 crossbar array results in a summation to be performed within each row of the crossbar array. However, this time the results are only discriminated among five values 0V, 100 mV, 200 mV, 300 mV, and 400 mV instead of the nine possible analog outputs of the 8×15 crossbar array. A second interface circuit analogous to that of FIGS. 9a-9b may be used to connect the 15×18 crossbar array to a $2^{nd}$ 15×18 crossbar array. The second interface circuit should be identical to that of FIGS. 9a-9b except it would be extended to address 18 output rows and the A/D circuits used would have a three (instead of four) bit resolution resulting in a reduction from four to three AND gates per loading signal and only up to three (instead of four) inputs per OR gate. Loading the A/D converted outputs into the $2^{nd}$ 15×18 crossbar array results in the crosspoints programmed as illustrated in FIG. 11. As noted previously, as an alternative to AND/OR gates, the binary outputs from the first interface circuit may be temporarily stored in a buffer or storage register to be loaded into a subsequent crossbar array.

The analog outputs of the crossbar of FIG. 11 only have three possible values 0 mV, 100 mV, or 200 mV thus two bit A/D conversion may be used and the post-processing circuitry of FIG. 6 (except extended to 18 rather than 8 rows) may be used to generate an output. Given the current example of 11111111×11111111, the full and half adders of the post-processing circuitry produce the result 1 1 1 1 1 1 1 0 0 0 0 0 0 0 1, which is indeed the desired product (255×255=65,025.)

Figure 12:
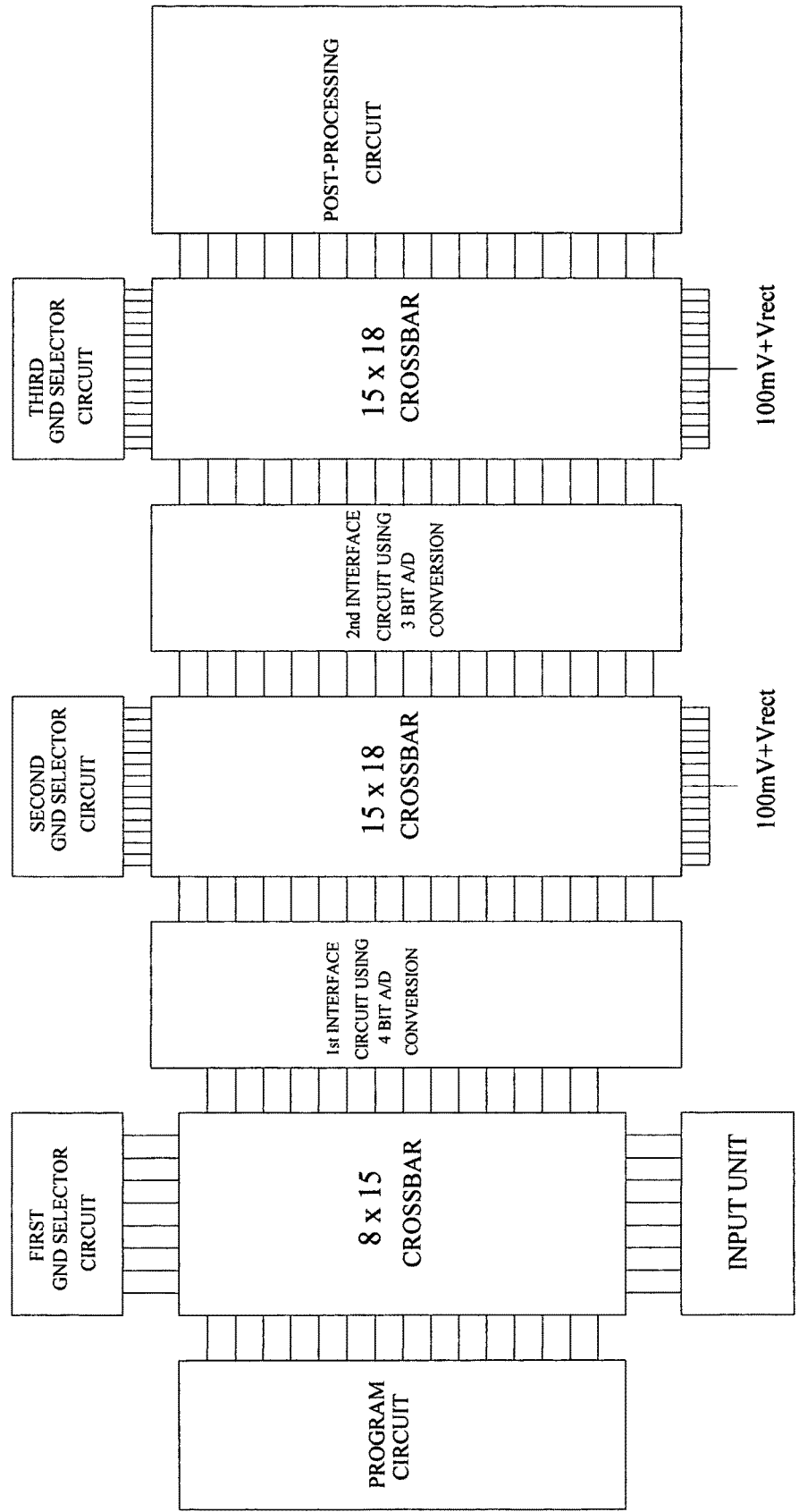
FIG. 12 illustrates the general layout for a crossbar arithmetic processor configured for 8-bit by 8-bit multiplication.

FIG. 12 illustrates the general layout for a crossbar arithmetic processor configured for 8-bit by 8-bit multiplication as described above. However, this circuit configuration may also be used for addition of up to 8 different 15 bit numbers or in a numerical integration procedure by loading in different bit values instead of the same value shifted within different columns as in the multiplication process.

IV. Large Number Processes

In the above examples it was shown that crossbar circuitry may be used to perform addition and multiplication procedures by combining multiple crossbar arrays with known circuit elements. However, conventional arithmetic logic units already perform these operations and are much better developed within microprocessor architectures. One may ask what the added benefit is of having a crossbar structure perform addition and multiplication procedures.

One benefit is that crossbar technology is a good candidate for molecular scale electronics and extending computational ability to devices that work on the nanometer scale allows for higher density arithmetic processors to be created. However, in addition to this benefit, crossbar arithmetic processors are seen to have the potential for extending the ability of numerical calculation beyond what is achievable by conventional Arithmetic Logic Units.

One of the limitations of conventional ALUs is that, when dealing with large numbers, mathematical operations such as multiplication, division, and factorization become exceedingly time consuming, especially when these operations have to be performed repeatedly. The typical reason for this is that these mathematical processes are sequentially performed in conventional ALUs in terms of individual addition steps and thus the clock speed determines the size of the data that can be processed in a reasonable time. Crossbar arithmetic processors of the current invention can avoid this problem because they are well suited to performing multiplication and division processes without resorting to incremental addition (or subtraction) steps.

Figure 13:
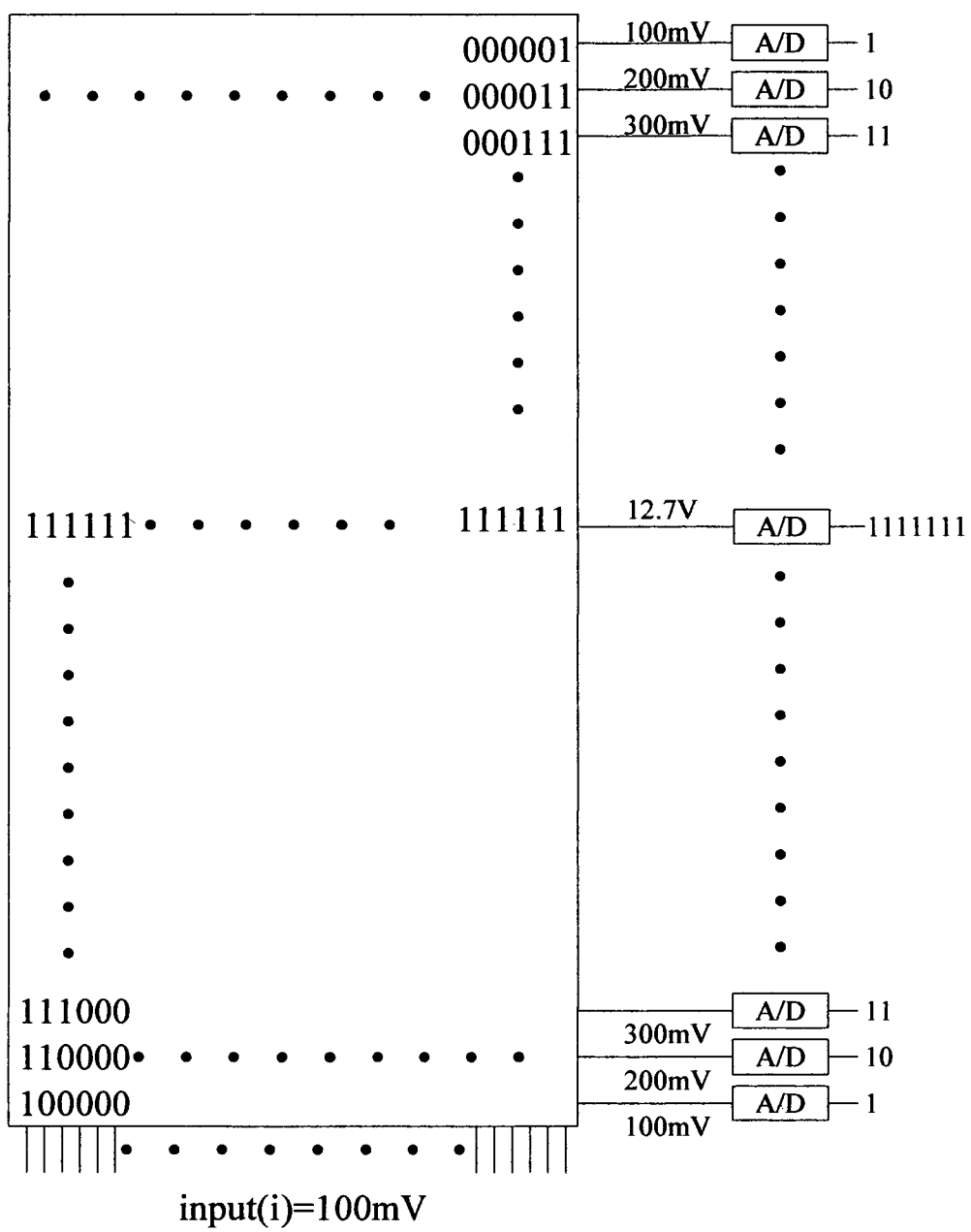
FIG. 13 illustrates a 127×253 crossbar array loaded with a binary number equal to $2^{128}-1$ in each column shifted 1 bit position per column as appropriate for a multiplication operation.

For example, if one were to start with a 127×253 crossbar array, multiplication processes with 127 bit multiplicands and 127 bit multipliers could be performed. FIG. 13 illustrates such a 127×253 crossbar array loaded with a binary number equal to $2^{128}-1$ in each column shifted 1 bit position per column as appropriate for a multiplication operation. Note that the shifting is performed so as to form a diagonal pattern that equalizes the parasitic effects of the crossbar, which are maximal toward the upper left hand side of the array because of the longer wiring path and minimal at the lower right hand side because of the shorter wiring path. For the current example the multiplier is set to $2^{128}-1$ by setting all 127 inputs to a voltage equivalent to a logic 1 such as 100 mV in order to examine the maximum possible output state. The analog outputs produced by each row of the crossbars increase from the first row from 100 mV to 12.7 V. Similar to that of the earlier example, interface circuitry may be used to process these analog signals. Based on the number of possible analog levels achievable the first and last row may employ a 1-bit A/D converters, the second, third, $251^{st}$ and $252^{nd}$ row may employ 2-bit A/D converters, the fourth-seventh and 247-$250^{th}$ rows may employ 3-bit A/D converters, etc. up to the $127^{th}$ row which employs a 7-bit A/D converter. In general the bit size of an A/D converter for a particular row may be chosen as $\log_2 R$ where R is the maximum possible number of analog output values for that particular row.

Figure 14:
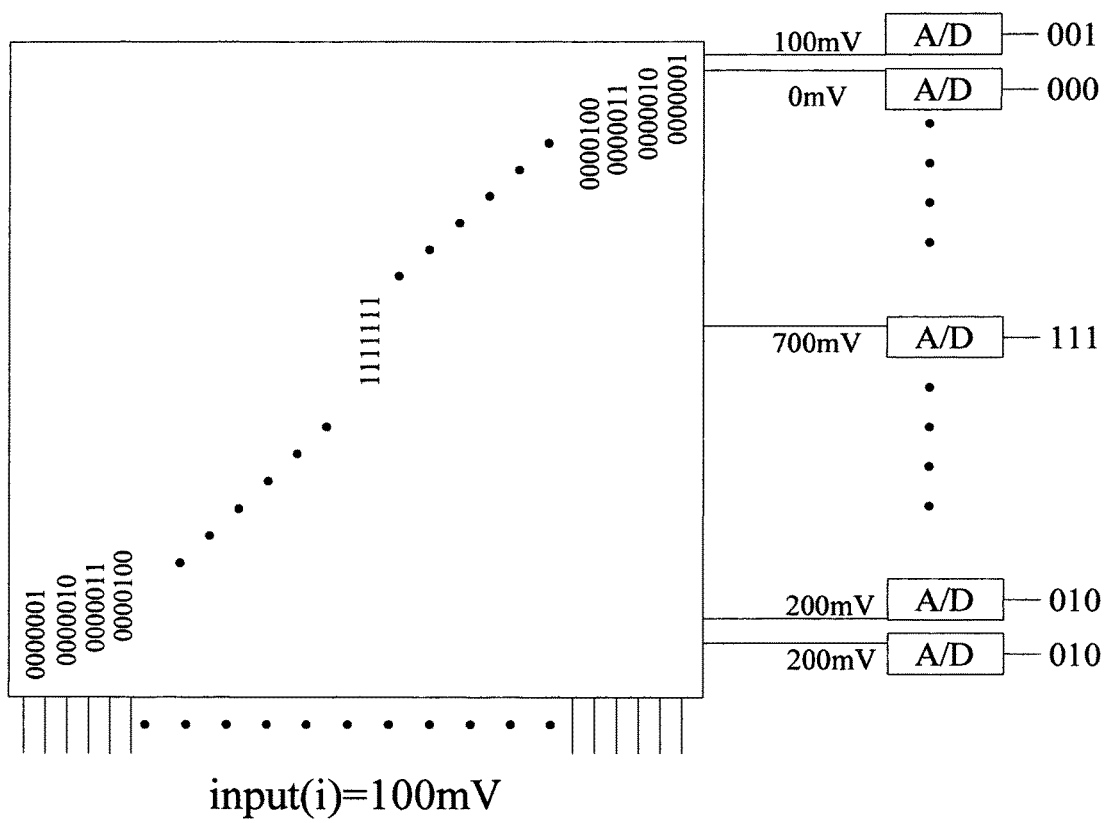
FIG. 14 illustrates the operation of a $1^{st}$ 253×253 crossbar array performing crossbar arithmetic.

Each of the A/D converted outputs from the 127×253 crossbar array may be stored in a data register or processed by AND/OR gates so as to provide programming input for a 253×253 crossbar array, as shown in FIG. 14. In this case the largest possible number of analog output values from the center rows is eight (0 mV, 100 mV, . . . , 700 mV) and thus three-bit A/D converters are the greatest resolution necessary. Note that the stored data values of FIG. 14 are shown in 7-bit format for exemplary purposes only since the zeros in the bottom rows would be outside the range of the crossbar size (extending the crossbar array to hold six extra rows in this example would be pointless because the data content is zero for these rows even for the case of maximum input.)

Figure 15:
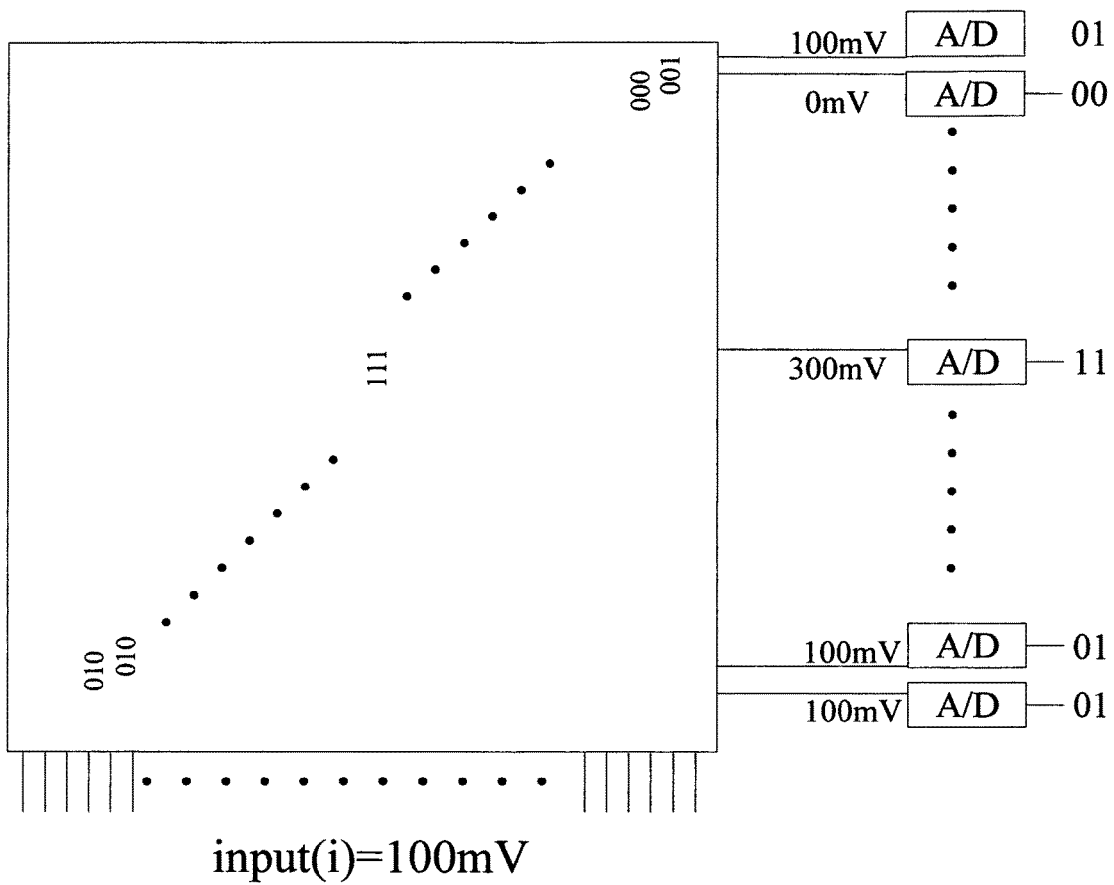
FIG. 15 illustrates the operation of a $2^{nd}$ 253×253 crossbar array performing crossbar arithmetic.

Using a second 253×253 crossbar array, as illustrated in FIG. 15, the output data from the A/D converters of the first 253×253 crossbar array may be loaded and summed. However, this time the analog output of any row has at most four possible states (0 mV, 100 mV, 200 mV, 300 mV). A post-processing circuit similar to that in FIG. 6 may be used except extended to include sufficient clearing transistors, A/D converters, and bit adding circuits for 253 rows.

Thus 127 bit by 127 bit multiplication may be performed with a crossbar array. While the time taken to perform such an operation would be limited by the amount of time taken to load the cascaded crossbar processors, which in this case is equal to (127+253+253) multiplied by the amount of time to load a single column, this may rival and even far surpass conventional processor computing speed which attempt the same multiplication process (depending on the switching speed of the resistance of the programmable material between high and low resistance states).

In addition to large number multiplication processes, large number addition processes may be performed to integrate a set of large numbers. In this case the A/D converters associated with the rows of the first crossbar array would be the same resolution since the maximum number of possible analog output values would be invariant with respect to the rows. For example, for a 127 column and 127 row crossbar array, a 7-bit A/D converter should be used for the analog output from each row.

V. Division and Large Number Factorization

Figure 16:
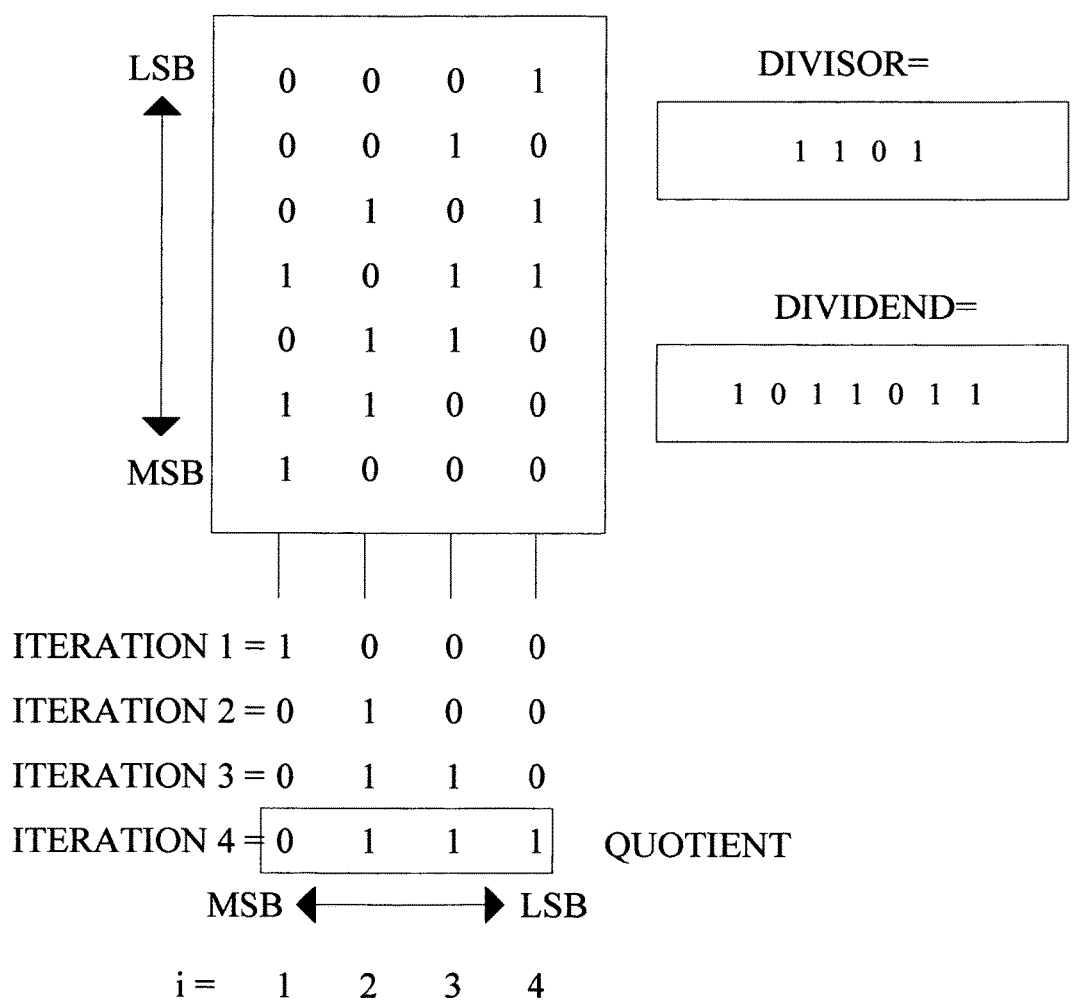
FIG. 16 illustrates a 4×7 crossbar array used in a division procedure.
Figure 17:
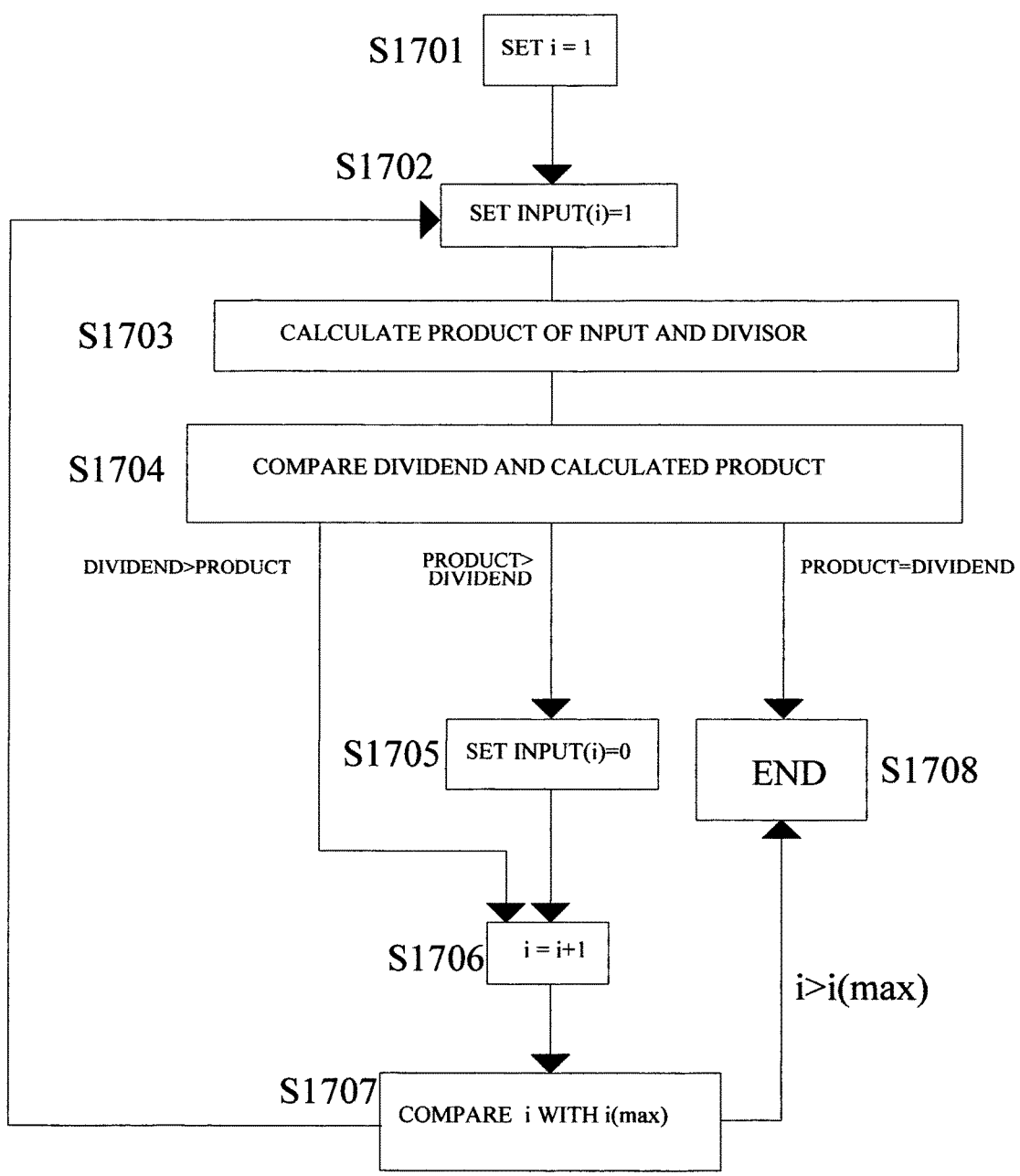
FIG. 17 illustrates a flowchart of a division procedure.

Division may be performed by a crossbar processor by diagonally programming a binary numerical value in the columns of the crossbar array, as was done in the multiplication processes, and altering the input to the crossbar array while comparing the product obtained with the intended number to be divided. FIG. 16 illustrates a 4×7 crossbar array used in a division procedure and FIG. 17 illustrates a flowchart of the division procedure. In this example, the programmed data is 1101 representing a divisor of 13 and the number to be divided (i.e. dividend) is 1011011 representing numeral 91. The input data is set to initially set to 0000, and i represents the bit number from the most significant bit (i=1) to the least significant bit (i=4). In steps S1701 and S1702 the MSB is set to 1 and the product is calculated using the crossbar processor (S1703). The product 1101× 1000 produces the result 1101000. Comparison of this value to the dividend 1011011 (S1704) may be performed by comparing the bit values in the order from the most significant value to the least significant value with an array of comparator circuits or by a general purpose microprocessor. In the case that the product is detected to be larger than the dividend, input(i) is set back to 0 (S11705) and the bit position being examined is incremented (S1706). In the case that the product is detected to be smaller than the dividend, input(i) remains at 1. In step S1707 if the bit position being examined is greater than the maximum bit number (in this case 4) the process is ended (S1708). For the current example the process goes through four iterations testing the values of 1000, 0100, 0110, and finally 0111 for a total of four iterations. In this case, the process stops based on step S1704 in which it is found that the calculated product equals the dividend. The quotient is then equal to the final iteration of the input. In a case where there is a remainder this may be calculated based on the difference between the dividend and the calculated product. It is noted that the algorithm of FIG. 17 may also be applicable to conventional arithmetic processors for increased speed of division processing.

Extending the above example to large number crossbar processors, such as the 127×253 crossbar array previously discussed, it is evident that a first arbitrary 254 bit number may be divided by a second arbitrary 127 bit number. The amount of time taken to perform such an operation would equal the time necessary to load the initial crossbar array plus the time necessary to load the second and third crossbar array multiplied by the number of necessary multiplication iterations to be checked. This time may be computed as [127+127×(253+253)]×the amount of time to load a single column of the crossbar.

It has been estimated that it would be computationally infeasible for a conventional microprocessor to factor a particular number that is on the order of a hundred digits long, and which is the product of a first large prime number and a second large prime number, in a reasonable amount of time. However, given a particular 127×253 crossbar arithmetic processor that employs a programmable material with a switching time of 1 μs, and knowing one prime factor (of size 127 bits or less) of a 254 bit number, the second prime factor may be found in about [127+127×(253+253)]×1 μs=64.4 ms.

VI. Network Optimization, the Traveling Salesman Problem, and Genetic Algorithms Other mathematical procedures besides addition, subtraction, multiplication, and division operations that depend upon repeated multiplication and/or summing of terms may be performed by a crossbar arithmetic processor. Certain procedures requiring repeated summation of common terms may particularly benefit from the attributes of crossbar arithmetic processing. Some examples of such procedures are explained in the current section.

Figure 18:
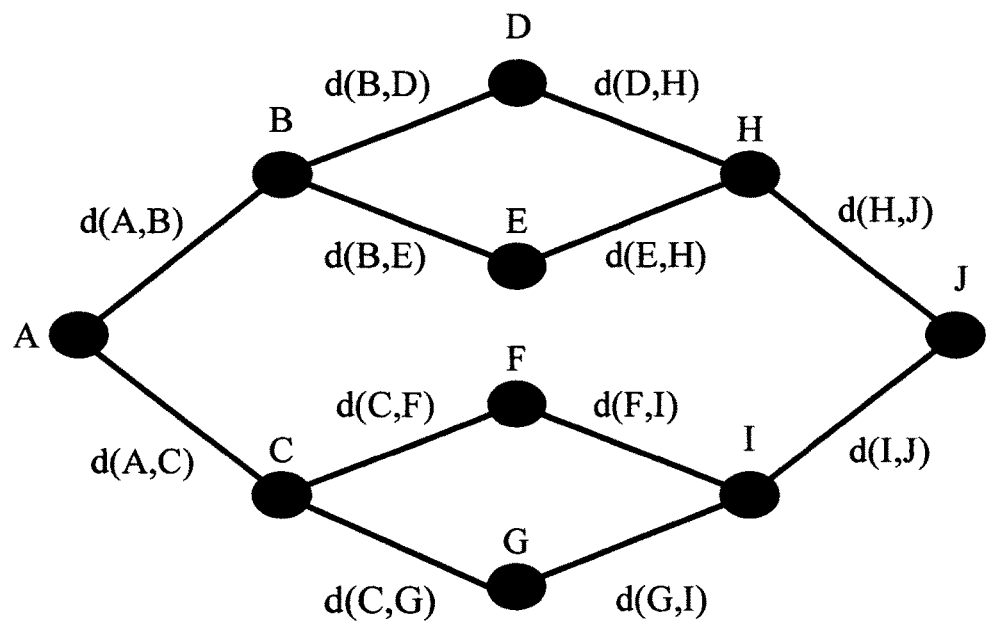
FIG. 18 illustrates a plurality of nodes (A-J) and a plurality of connection paths connecting initial node A to final node J.

FIG. 18 illustrates a plurality of nodes (A-J) and a plurality of connection paths connecting initial node A to final node J. This set up is analogous to a communication network in which a signal may have several possible paths to travel among several nodes (i.e. relays) between two points. However, factors such as transmission time, bandwidth capacity, etc. of different communication paths may differ so that it is desirable to find the optimum path which minimizes (or maximizes) one of these factors. In the example of FIG. 18 there are four possible paths shown $$d_1(A,J)=d(A,B)+d(B,D)+d(D,H)+d(H,J)$$

$$d_2(A,J)=d(A,B)+d(B,E)+d(E,H)+d(H,J)$$

$$d_3(A,J)=d(A,C)+d(C,F)+d(F,I)+d(I,J)$$

$$d_4(A,J)=d(A,C)+d(C,G)+d(G,I)+d(I,J)$$

where each of the inter-node factors d(A,B), d(A,C), etc. represents the numerical value of the factor of interest between particular nodes. These factors of interest may be time dependent and based on a plurality of variable conditions. Crossbar arithmetic processors may be used to compute these sums by programming each column of the crossbar with one of the various values d(A,B), d(A,C), etc. and selecting binary inputs that match up with a particular sum of interest. For example, if column 1 were set to d(A,B), column 2 were set to d(B,D), column 3 were set to d(B,E), column 4 were set to d(D,H), column 5 were set to d(E,H), and column 6 were set to d(H,J), $d_1(A,J)$ could be calculated by inputting 110101 to the crossbar array while $d_2(A,J)$ could be calculated by inputting 101011 to the crossbar array. Comparison of the resulting values may then produce a minimum (or maximum). At periodic intervals the inter-node factors d(A,B), d(A,C), etc. may be reevaluated, individual columns of the crossbar array may be cleared and then reprogrammed according to the reevaluated values, and the calculations and comparisons may be performed again.

Figure 19:
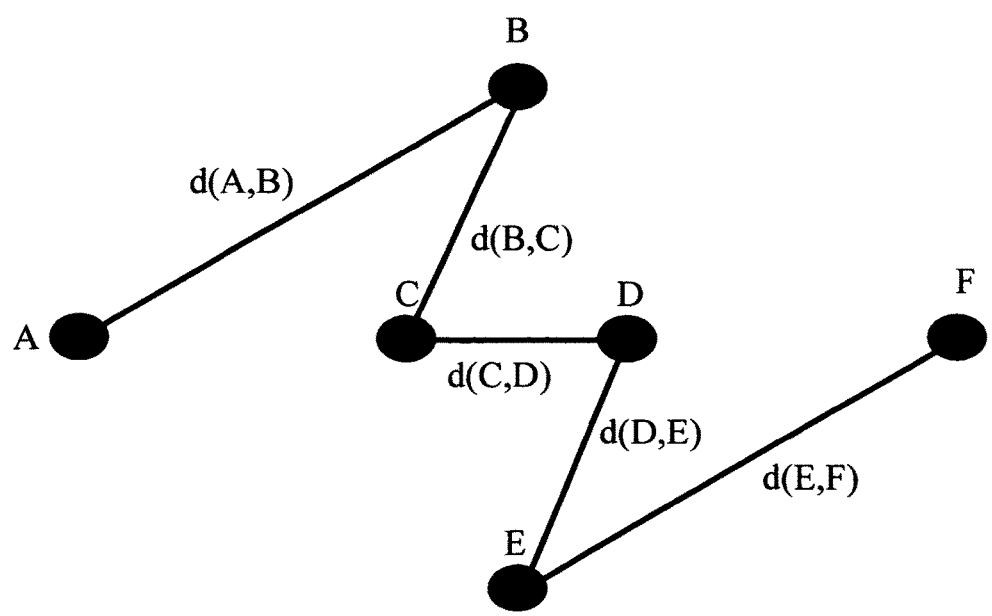
FIG. 19 illustrates one possible path in a traveling salesman problem.

Another example of the use of a crossbar arithmetic processor is in finding the optimum pathway when traveling between a set of nodes wherein each node must be traversed exactly once by the same path (this is sometimes referred to as the traveling salesman problem). In this case the summing term must contain each of the inter-node factors d(A,B), d(B,C), etc which are representative of transmission time, bandwidth capacity, or other factors of interest between particular nodes. FIG. 19 illustrates one possible path $$d_1(A,F)=d(A,B)+d(B,C)+d(C,D)+d(D,E)+d(E,F)$$

Other possible paths may be generated by swapping nodes. For example B swapped with E gives:

$$d_2(A,F)=d(A,E)+d(E,C)+d(C,D)+d(D,B)+d(B,F)$$

In all there are 4!=24 possible paths that may be taken and 20 different inter-node factors d(A,B), d(B,C), etc. For the general case of N nodes (not counting the end points) there are N! possible paths, N×(N+1) different inter-node factor values, and N+1 terms involved in any one of the sums. In the current example, using N=4, a crossbar array with 20 columns may be used, each column programmed with a particular inter-node factor, and the number of rows determined by the size of the maximum data for a particular inter-node factor. However, any given sum will involve only 5 columns, therefore 3-bit A/D converters may be used at each row output of the initial crossbar array used in the computation, followed by a second crossbar array and a postprocessor as in earlier examples. Iteration through the various possible input values (24 possibilities) and comparison of the resulting values may then produce a minimum (or maximum). At periodic intervals the values d(A,B), d(A,C), etc. may be reevaluated and individual columns of the crossbar array may be cleared and then reprogrammed according to the reevaluated values.

It is noted that when dealing with a large number of nodes in the above examples, the techniques of genetic algorithms may be used to help find the optimum sum. For example, taking the node arrangement of FIG. 19, the columns of a crossbar array may be programmed with the numerical values associated with d(A,B), d(A,C), d(A,D), d(A,E), d(B,C), etc. in such an order that the first four columns contain the inter-node factors leading out from node A, the second four columns contain the inter-node factors leading from node B, the third four columns contain the inter-node factors leading from node C, etc. Programming the columns in such a fashion, the numerical sum associated with the path shown in FIG. 19 may be calculated by inputting 1000 1000 0100 0010 0001 into the crossbar processor. Inputting 0001 0001 0100 1000 0100 results in another possible path equivalent to $d_2(A,F)$ noted above. While not all possible binary inputs result in valid paths from node A to node F, certain rules may be formulated to determine or check whether a particular binary pattern is representative of a legitimate path. The set of all valid inputs may be used to form a population of possible solutions to be checked by the crossbar arithmetic processor. While the case of only 4 intermediate nodes contains only 24 possible solutions to be checked, an increase in the node number quickly raises the number of possible solutions. In this case a random subset of the possible solution population may be selected. Processing each of these inputs by a crossbar arithmetic processor and comparison of the results may be used as an evaluation step. Recombination may be performed by appropriately mixing bit segments of the inputs that produced the most highly evaluated outputs and creating a next population to be evaluated. If poor evaluation is found for the current population mutation may optionally be performed by adding other permissible binary inputs to the population. The repeated cycle of evaluation, recombination, and mutation may be performed until a sufficiently optimized path is found.

Other algorithmic implementations such as sorting algorithms may be used to optimize the path. In the case of a swapping algorithm each column of the crossbar array may be programmed with the numerical value of an inter-node factor and swapping individual nodes may be performed by exchanging inter-node factors. For example, suppose the optimum path from node 1 to node 6 was given by $d(A)=d(1,2)+d(2,3)+d(3,4)+d(4,5)+d(5,6)$ and a random initial path is selected as $d(A_1)=d(1,5)+d(5,2)+d(2,4)+d(4,3)+d(3,6)$. Each column of a five column crossbar array may be used to store one of the inter-node factors of $d(A_1)$ so as to calculate the sum $d(A_1)$. All possible inter-node values (20 for the current example) may be stored in a separate data register to be used when reprogramming the necessary columns during a particular node swap.

Swapping of the first adjacent nodes of $d(A_1)$ (i.e. nodes 2 and 5) may be performed by replacing three of the crossbar columns with inter-node factors associated with the swapped nodes. This operation produces a new possible path and a new summed result $d(A_2)=d(1,2)+d(2,5)+d(5,4)+d(4,3)+d(3,6)$. Numerical comparison between $d(A_1)$ and $d(A_2)$ may be performed to determine which of $d(A_1)$ or $d(A_2)$ is closer in value to the value of the optimum path $d(A)$. Swapping of the second adjacent nodes of whichever path $d(A_1)$ or $d(A_2)$ was determined to produce a sum closer to the optimum value may then be performed to generate $d(A_3)$ which is again compared to the previous value. This process may be performed repeatedly for all adjacent nodes in the path so as to approach an optimized path.

Generalizing for N nodes and using a periodic subscript notation such that node $A_{N+M}=A_M$, a particular randomly chosen path may be expressed as $d(A^*)=\Sigma d(A_i,A_{i+1})$ summed from $1 \le i \le N-1$. A new path created based upon swapping of a particular node j ($1 \le j \le N$) may be expressed as $d(A^*_j)=d(A)(A_j \leftrightarrow A_{j+1})$. If a particular $d(A^*) \ge d(A^*_j)$ for all possible j swaps, $d(A^*)$ may be said to be a locally optimized maximum swap path. If $d(A^*) \le d(A^*j)$ for all possible j swaps, $d(A^*)$ may be said to be a locally optimized minimum swap path.

Paths created by swapping nonadjacent nodes separated by k−1 intermediate nodes may be expressed as $d(A^*_{jk})=d(A)(A_j \leftrightarrow A_{j+k})$. If a particular $d(A^*) \ge d(A^*_{jk})$ for all possible j and k swaps, $d(A^*)$ may be said to be a generally optimized maximum swap path. If $d(A^*) \le d(A^*jk)$ for all possible j and k swaps, $d(A^*)$ may be said to be a generally optimized minimum swap path. Various swapping algorithms may be employed to systematically alter the column values of the crossbar array and perform compare and replacement steps so as to heuristically approach the optimized paths.

VII. Alternative Embodiments

FIGS. 22a-22d illustrates an alternative embodiment of the invention including weighted feedback resistors associated with op-amps and which does not need post-processing logic circuitry as described in previous embodiments. A 4×4 crossbar array 2202 is illustrated with input resistances 2201 electrically connected to the columns and set to values of $R-R_{low}$ where $R_{low}$ is an average value of the programmed low resistance state of the crosspoints of the crossbar array 2202. The op-amps 2203 include feedback resistors set in accordance with the bit significance of the row of the crossbar array. Analog to Digital converters 2204 convert the analog output of the op-amps to a binary equivalent.

Figure 22A:
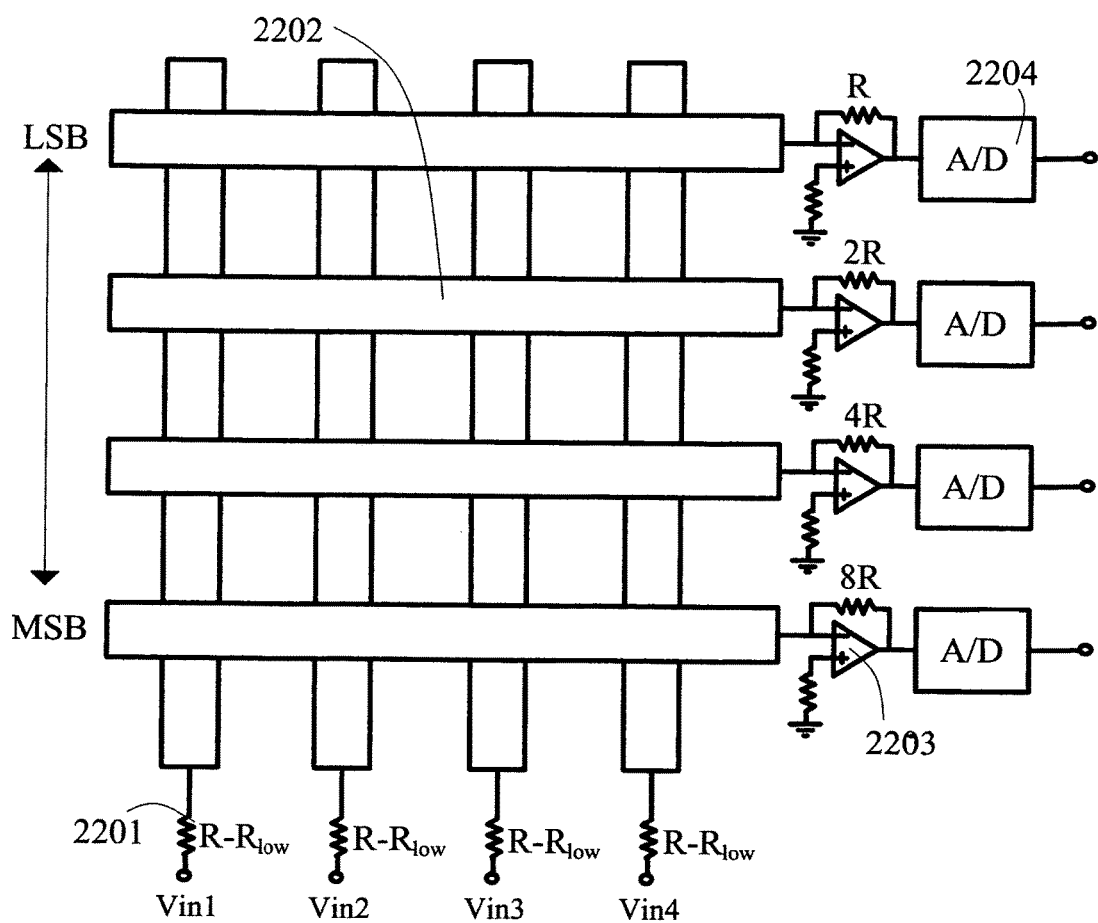
Figure 22B:
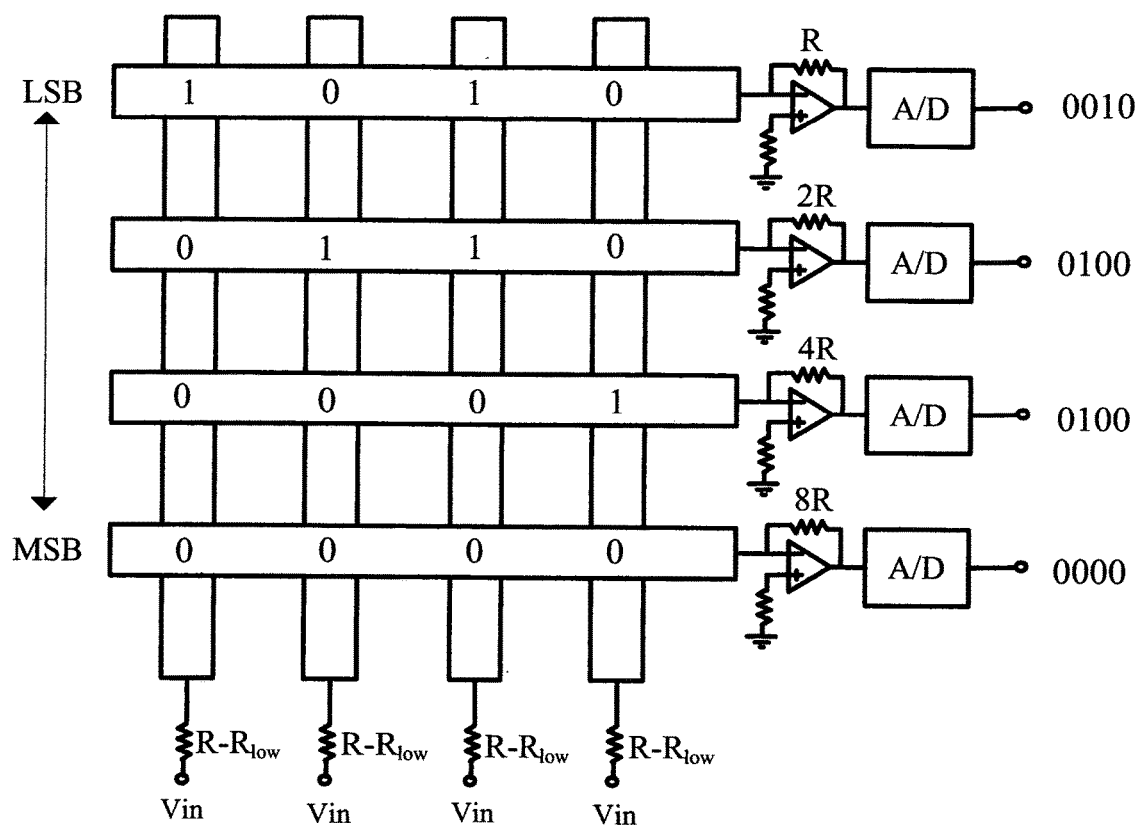
Figure 22D:
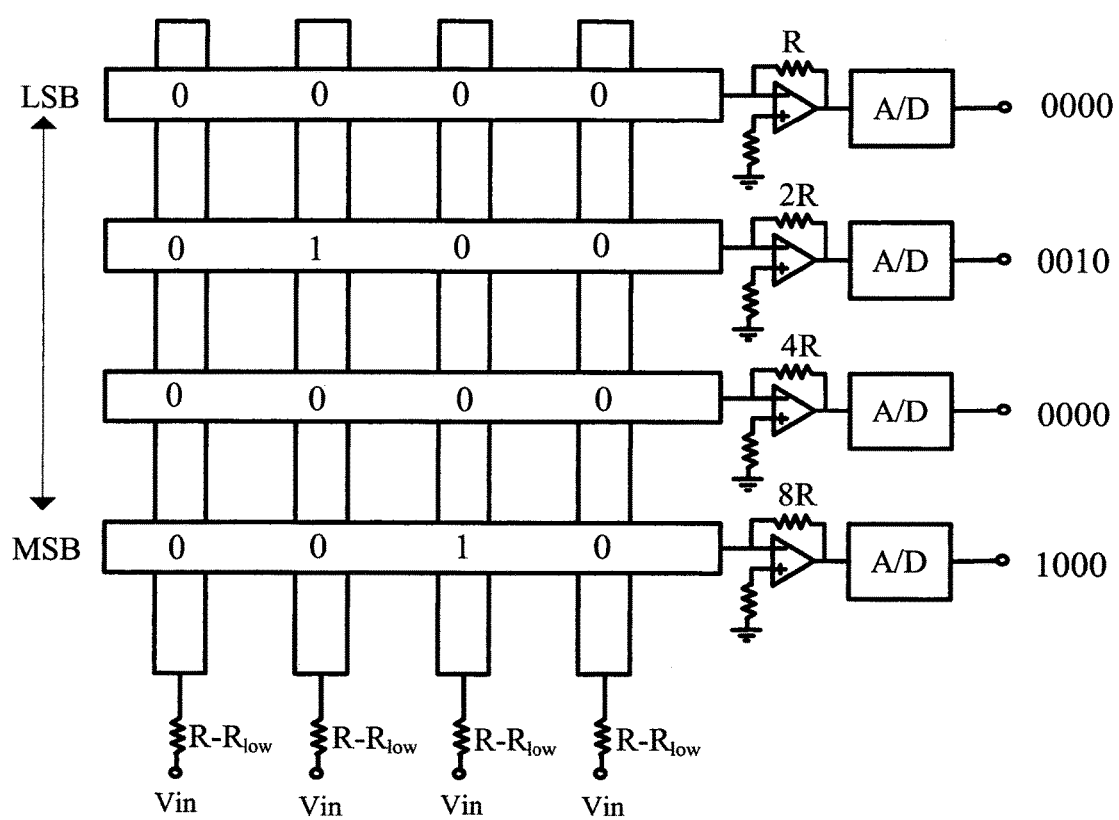

FIGS. 22b-22d illustrate an example of the operation of this embodiment of the crossbar array in summing 0001, 0010, 0011, and 0100. In FIG. 22b, the binary patterns are stored in terms of resistance states of the crosspoints in the form of a high resistance state for binary 0 and low resistance states for a binary 1. In the lower row (the most significant bit row), all of the crosspoint resistance states are set to a high value leading to limited current conduction from the row and a negligible voltage output from the op-amp which is converted to the binary pattern 0000 by the A/D converter. In the third row, only the crosspoint of the fourth column is set to a low resistance state and the op-amp amplifies the magnitude of the input signal according to the ratio of the feedback and input resistance producing an output voltage of approximately $4V_{in}$ which is converted to 0100 by the associated A/D converter. In the second row, the resistance states of the crosspoints associated with both the second and third column are set to a low value and the op-amp acts as a summing amplifier producing an output of approximately $(2+2)V_{in}=4V_{in}$ which is converted to 0100 by the A/D converter. In the top row (the least significant bit row), the crosspoints of the first and third columns are set to a low resistance state and the output of the op-amp is $(1+1)V_{in}=2V_{in}$ which is converted to 0010 by the A/D converter. The binary outputs from each of the A/D converters is stored and input into a second crossbar array or, alternatively, used to reset the states of the first crossbar array if only a single crossbar array is desired to be used. FIG. 22c illustrates the binary outputs from each of the A/D converters programmed into the crossbar array columns and the resultant outputs. FIG. 22d illustrates a third and final iteration in which the output of the A/D converters produce a value associated with the bit significance of the particular row. Repeated iterations would not change the outputs since a repeated reprogramming of the crossbar states would essentially produce a "diagonalized" crossbar with only the crosspoints at the intersection of the second row and column and the fourth row and column at a low resistance state. The complete summed value can be obtained by setting bit values of a resultant digital value in accordance with whether the corresponding row of the crossbar produces a non-zero value. In the example of FIGS. 22b-22d, the summed value corresponds to 1010 which is indeed the sum of 0001, 0010, 0011, and 0100 in the binary number system.

The embodiment of FIGS. 22a-22d may of course be performed with a greater number of columns and/or a greater number of rows. For a greater number of rows, the feedback resistances of the op-amps associated with the added rows can be set to higher multiples of 2 (16, 32, etc.) as the bit significance increases. It is noted that as the number of columns are increased the ratio of the high to low resistance values of the crosspoints becomes more important since a large number of high resistance states may begin to produce a current comparable to that produced by a low resistance state. As a rule of thumb it may be optimal to set a limit on the maximum number of columns to be less than $\frac{1}{10}^{th}$ the ratio of the average high resistance state to the average low resistance state to reduce the likelihood of a large number of high resistance states being interpreted as a low resistance state. For example, for an average high resistance state of 1 megaohm in the crosspoints and an average low resistance state of 10 kohms in the crosspoints the number of columns should be limited to 10 or less using this rule of thumb. It is also noted that, as would be understood by a person of ordinary skill in the art given the above description, it is highly desirable to choose the variable resistance material and the dimensions of the crossbar wiring so as to have a minimum variation in the low resistance values so as to have the $R_{low}$ value used in the input resistances to the columns as close to the actual values as possible.

Figure 23A:
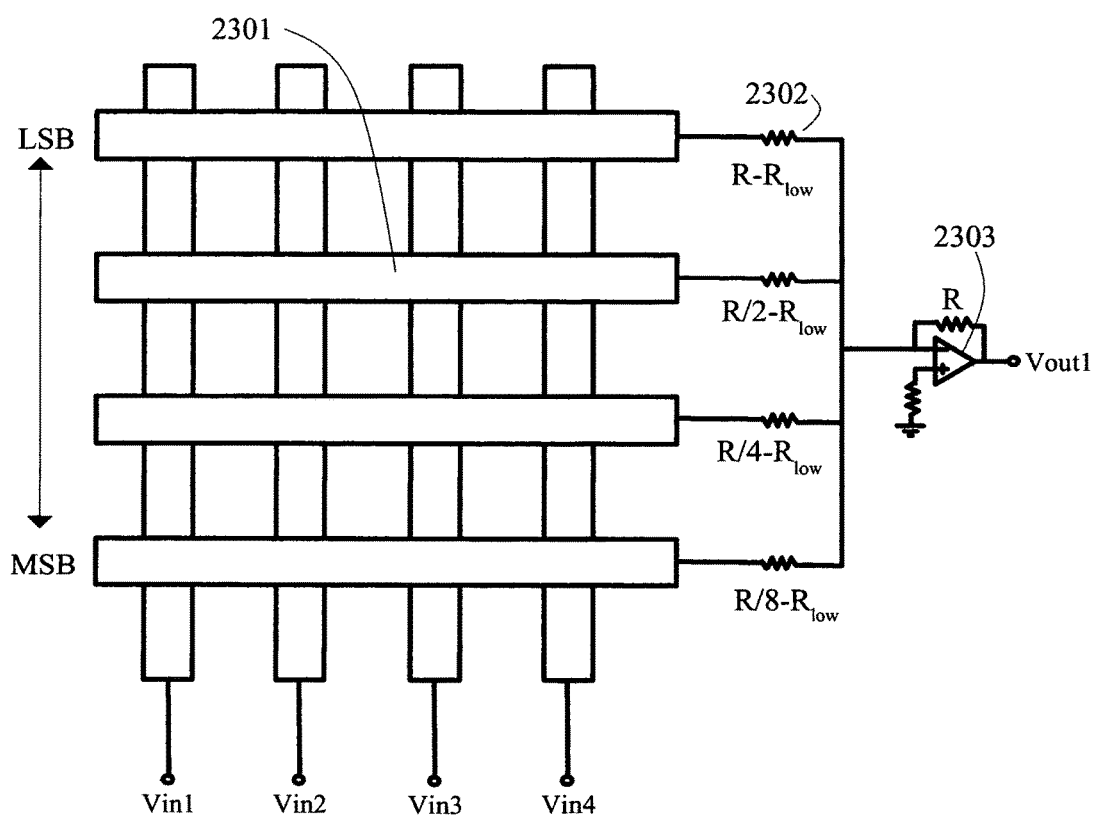
FIGS. 23a-23c illustrates an alternative embodiment of the invention including a single op-amp circuit electrically connected to the rows of the crossbar array.
Figure 23B:
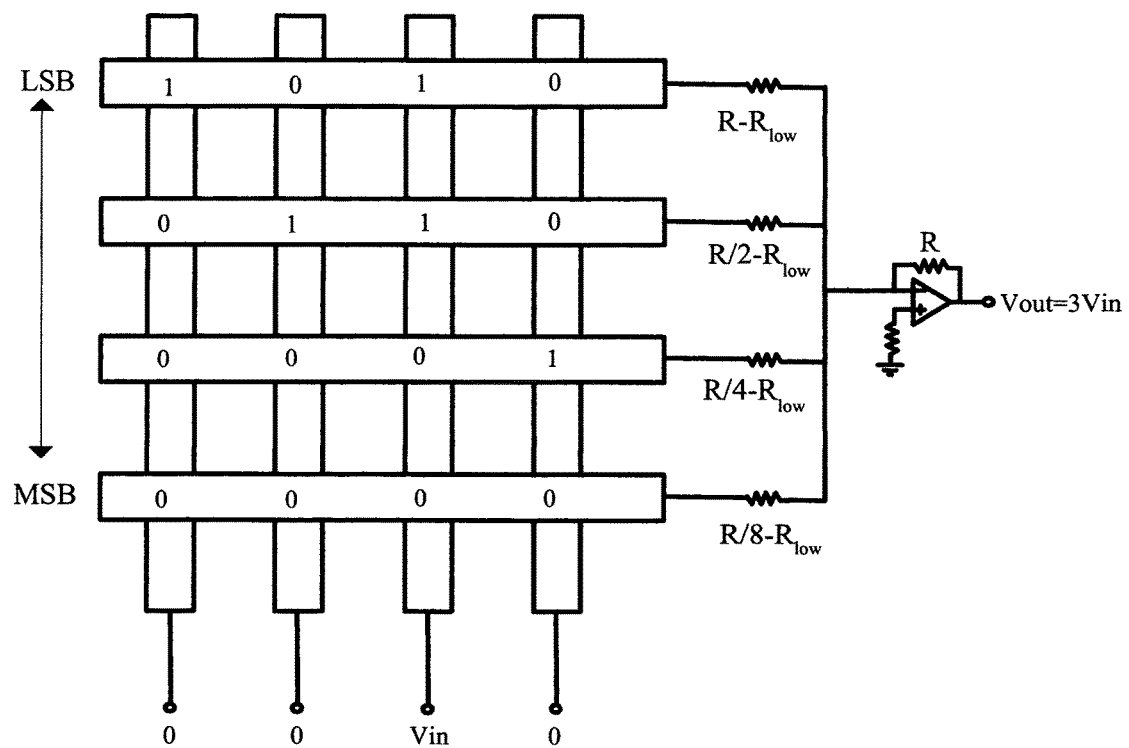
Figure 23C:
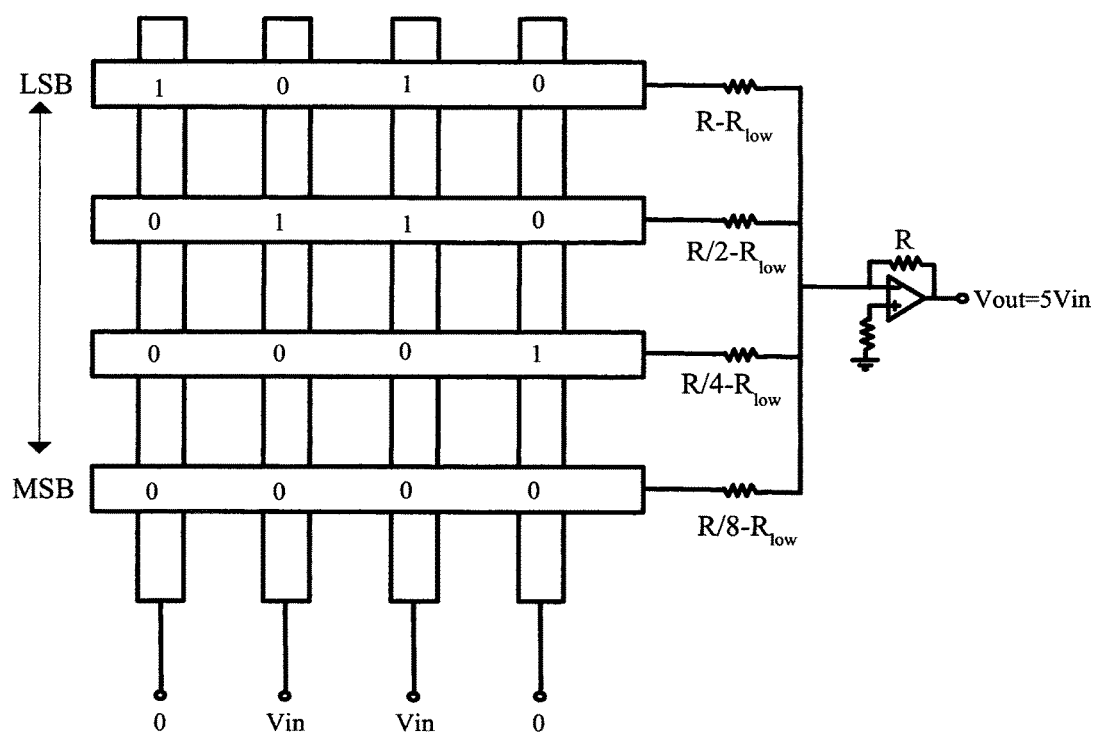

FIGS. 23a-23c illustrates an alternative embodiment of the invention including a single op-amp circuit 2303 electrically connected to the rows of the crossbar array 2301. Weighted resistances 2302 electrically connecting the rows of the crossbar array to the negative input of the op-amp 2303 are set in accordance with the significance value of the associate row with the rows providing an amplification factor of 1, 2, 4, and 8 based on the bit significance of the row, similar to the embodiment of FIGS. 22a-22d. This embodiment is particularly advantage to nanoscale crossbars for which electrical interconnection of the crossbar rows with multiple op-amps may be difficult to achieve.

FIG. 23b illustrates an example of the columns of the crossbar array loaded with the binary numbers 0001, 0010, 0011, and 0100 and the selection of the third column. It is noted that this configuration can be used as a programmable digital to analog converter and/or as a waveform generator by sequentially controlling inputs to the columns of the crossbar to select one column at a time. In FIG. 23b the selection of the third column produces an output of $3V_{in}$, which is the analog equivalent of the binary pattern stored in the third column (0011). Sequentially selecting each input column may also be used to generate a ramped step wave output with values 1V, 2V, 3V, and 4V. A variety of configurations for stepped waveform generation may be created by selectively programming the binary numbers stored in the crossbar columns and controlling the selection and timing of the voltage inputs to the columns using a software implementation or a hardware implementation such as a shift register, counter, or other sequential logic device as is known in the art.

FIG. 23c illustrates an example of multiple columns being selected resulting in a summation of binary values stored in the second and third columns. An analog-to-digital converter (not shown) may optionally be provided to convert the output of the op-amp to a digital value, as in the embodiment of FIGS. 22a-22d. However, this may not be necessary in many applications. For example, if a crossbar processing system similar to that of FIG. 23c is used to compute a network optimization problem, such as described above in section VI, analog outputs based on a selection of different input columns may be compared to one another to identify a maximum or minimum output value without a conversion to a digital value.

It is noted that the embodiments of FIGS. 22a-22d and 23a-23c may of course also implement addition, subtraction, multiplication, division, and optimization procedures in accordance with the descriptions provided in the previous sections.

VIII. Modifications/Alternatives

Many modifications and alternatives to the current invention may of course be implemented and a person of ordinary skill knowledgeable in resistance variable materials, crossbar arrays, processor design, or computation would clearly see many obvious variants to the teachings contained herein. For example, while crossbar arrays have typically been formed from two sets of wires that are orthogonal to each other they may also be formed from intersecting wires formed at a non-orthogonal angle such as 80 degrees, 60 degrees, 45 degrees, 30 degrees, etc. While examples were given of a 3×8, 4×4, 8×15, and 127×253 crossbar arrays many other configurations are conceivable.

As noted in the Background of the Invention a variety of candidates exist for the programmable material of the crossbar array including conducting polymers, organic semiconductors, perovskite materials, silver-selenide/chalcogenide films, as well as molecular components such as rotaxane used in nanowire crossbars. In addition, a variety of materials with voltage controlled resistive properties exist that have not yet been used in crossbar arrays. For example, Nugent U.S. Pat. No. 6,995,649 discloses using voltage controlled orientation of high aspect ratio nanoparticles as a means of variable resistance control. Any known molecular structure, material, or combination of materials with a voltage or current controlled resistance may potentially be employed in a useful fashion within the framework of the current invention.

When a particular resistance programmable material/molecule has a conductive state that is a relatively high impedance, low currents will be produced. This may help reduce problems generated by undesired current-induced heating. However, if the current produced is so low that it approaches the level of anomalous currents produced by noise or thermal currents, proper operation will be impeded. To address these problems noise filters may be added to the input and output circuitry and/or cooling may be provided to reduce thermal current.

Figure 20A:
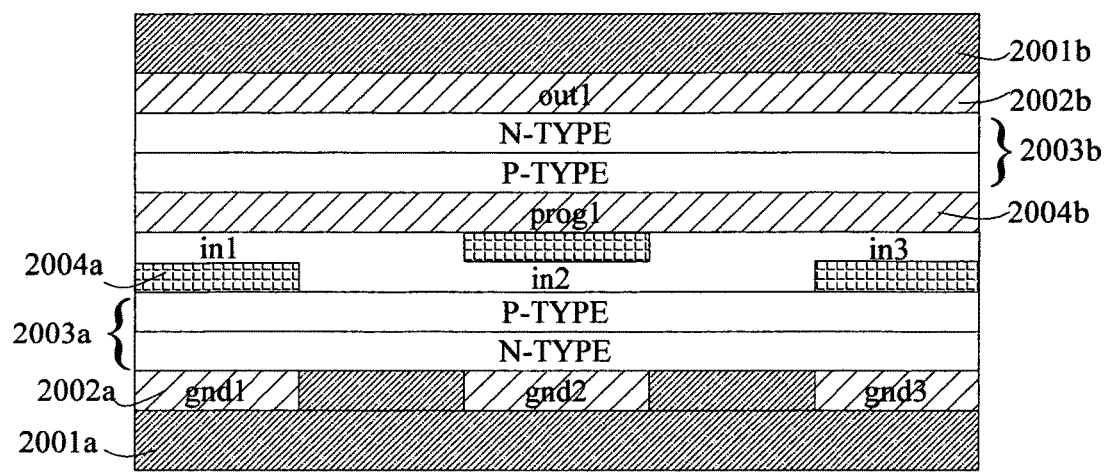
FIGS. 20a and 20b illustrate cross-sections of alternative embodiments of the crossbar array.

It is also conceivable to implement the current invention without use of a resistance programmable material and instead use direct electrical connection or disconnection between the wires in the crossbar array to achieve low or high resistance states. For example, one or both of the wiring layers may include nanotube ribbons or individual nanotubes as in Segal et al. U.S. Pat. No. 6,574,130. FIG. 20a illustrates a modification of the cross-section of FIG. 2c in which nanotube ribbons 2004a are used for the input wiring of the crossbar array. Insulating layers 2001a, 2001b, ground wiring layer 2002a, output wiring layer 2002b, rectification layers 2003a, 2003b, and programming wiring layer 2004b are the same as the corresponding layers in FIG. 2c. Sufficient electrical stimulation of selected programming and ground wiring may be used to either attract or repel the nanotube ribbon at particular crosspoints so as to form a mechanical connection such as a van der Wall bond between the nanotube ribbon and the programming layer at particular crosspoints. If mechanical connection is made at a particular crosspoint, the crosspoint would be able to conduct from the input wiring to the output wiring and is thus equivalent to a logic 1 in terms of the transfer function of the crossbar array (whereas disconnection would be a logic zero).

Figure 20B:
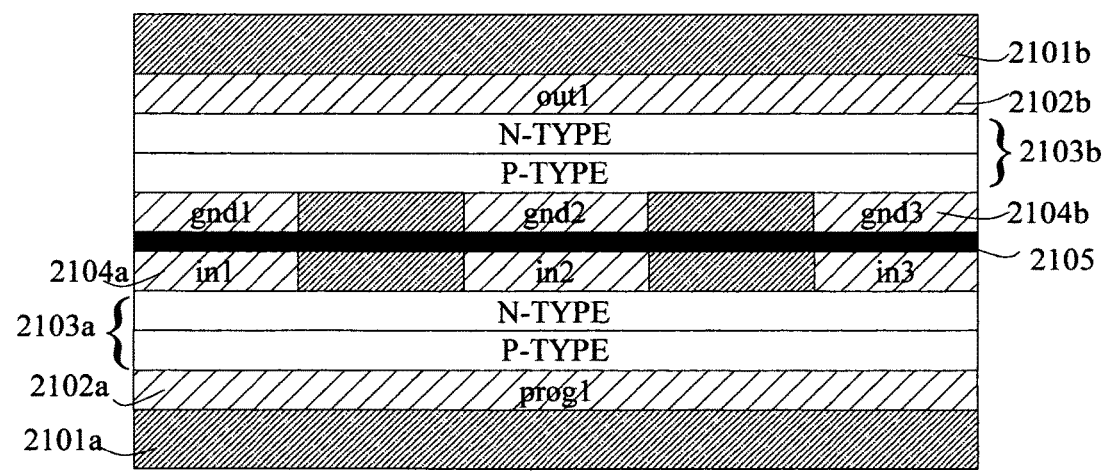

Depending on the characteristics of the programmable material of the crossbar array, the programming voltage may be of the same polarity to that of the input voltage, as in Campbell et al. U.S. Pat. No. 6,867,996. If this is the case, a modification of the crossbar array cross-section of FIG. 2c may be employed as shown in FIG. 20b. The structure of the crossbar array includes insulating layer 2101a, followed by wiring layers 2102a, which includes the programming wiring, rectification layer 2103a, allowing conduction only in the direction from the programming wiring to the ground wiring, input wiring layer 2104a, programmable resistance layer or layers 2105, ground wiring layer 2104b, rectification layer 2103b, allowing conduction only in the direction from the input wiring to the ground wiring, output wiring layer 2102b, and insulation layer 2101b. It is noted that the programming/ground selection circuits and input/output circuits are operated at different times and are preferably electrically isolated with different grounds and power supplies. The construction as illustrated allows for identical polarities to be used for both the programming voltages that are resistance altering and the operational voltages that are not resistance altering.

Figure 21A:
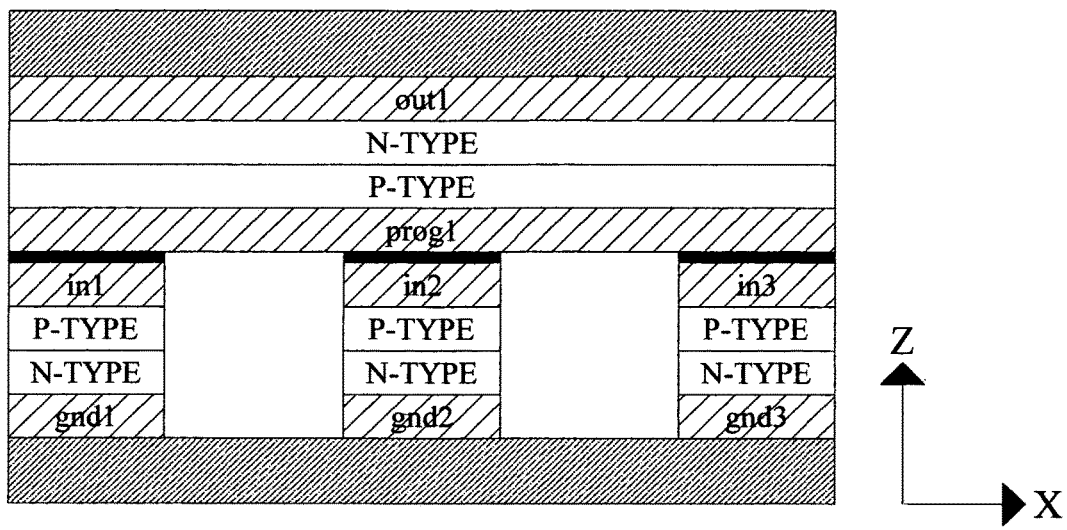
FIGS. 21a and 21b illustrate cross-sections along the y-axis and x-axis of an alternate embodiment of the crossbar array.
Figure 21B:
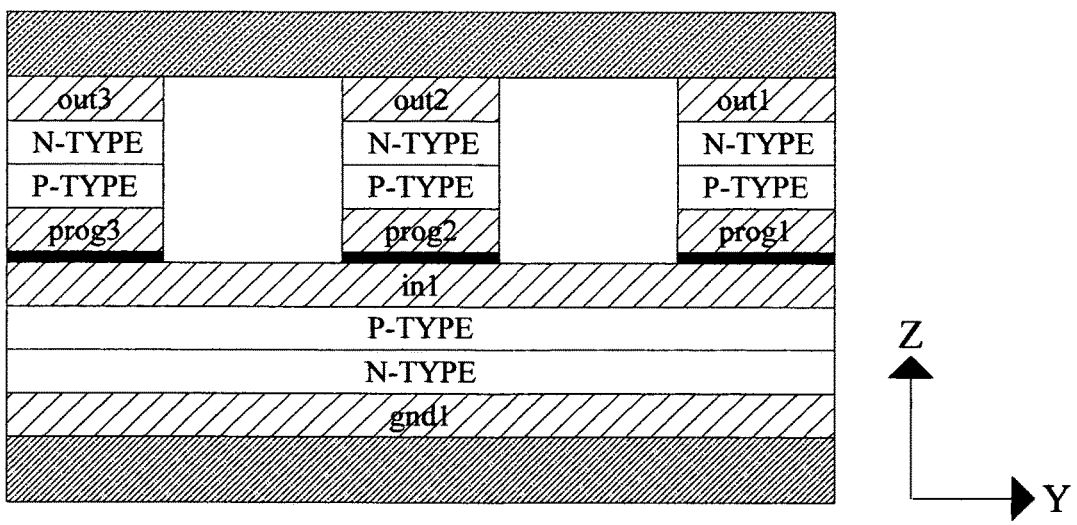

The rectification layers shown in FIG. 2c are formed as continuous layers. However, some leakage current may be present depending on the interspacing of the wires, the thickness of the rectification layer, and the relative surface resistance of the rectification layer as opposed to the wire resistances. To help avoid leakage current the rectification layer may be segmented into a different portion for each crossbar interconnection point with insulating material provided or empty spaces etched between the different rectifying segments. FIGS. 21a and 21b illustrate cross-sections along the y-axis and x-axis as an example of this construction.

As described above many modifications of the present invention are possible and many applications within the realm of computational science and processing are foreseeable. However, the present invention is only limited by the following claims.

I claim:

1. A processor comprising:
a crossbar array including row wires and column wires wherein bit patterns representative of numerical values are stored in a plurality of columns of the crossbar array and wherein the bit patterns store data in the form of high or low resistance states; and
an output unit electrically connected to the rows of the crossbar array configured to sum the numerical values stored in the columns of the crossbar array.

2. The processor of claim 1, wherein the output unit includes op-amps with feedback resistors electrically connected to each row wire of the crossbar array.

3. The processor of claim 2, wherein the feedback resistors are set to a value determined in accordance with a bit value of the numerical values stored in the columns of the crossbar array which are multiples of 2 times a base resistance.

4. The processor of claim 1, wherein the crossbar array is formed from a first crossbar section and a second crossbar section that sandwich a programmable material.

5. The processor of claim 4, wherein the first crossbar section includes a first rectification layer and a first array of parallel conductive wires and the second crossbar section includes a second rectification layer and a second array of parallel conductive wires.

6. The processor of claim 5, wherein the first rectification layer and the second rectification layer are continuous layers.

7. The processor of claim 5, wherein the first rectification layer and the second rectification layer are segmented into electrically isolated portions, each portion associated with an intersection point of the crossbars.

8. The processor of claim 4, wherein the first crossbar section is anti-symmetrical to the second crossbar section.

9. The processor of claim 4, wherein the first crossbar section includes a first insulating support substrate and the second crossbar section includes a second insulating support substrate.

10. The processor of claim 1, wherein the crossbar array includes a first insulating layer, a first wiring layer above the insulating layer, a first rectification layer above the first wiring layer, a programmable resistance layer above the first rectification layer, a second rectification layer above the programmable resistance layer, and a second insulation layer above the second rectification layer.

11. A method of performing a division process using the processor of claim 1 comprising:
a) diagonally programming a binary numerical value in the columns of the crossbar array;
b) setting a bit number representing a most significant bit to 1;
c) calculating a product using the crossbar processor;
d) comparing the product with a dividend in the order from a most significant value to a least significant value;
e) comparing the bit position being examined to a maximum bit number; and
f) ending the division process when the bit position being examined is greater than the maximum bit number.

12. The method of claim 11 further comprising:
in step d) if the product is determined to be larger than the dividend setting the bit number to 0 and incrementing a bit position being examined.

13. The method of claim 11 further comprising:
in step d) if the product is determined to be smaller than the dividend maintaining the bit number at 1 and incrementing a bit position being examined.

14. The method of claim 11 further comprising:
in step d) if the product is determined to be the same as the dividend ending the division process.

15. A method of performing an arithmetic process using the processor of claim 1 comprising:
a) programming resistance states representative of binary numerical values in the columns of the crossbar array;
b) performing an arithmetic operation using the processor.

16. A processor comprising:
a plurality of cascaded crossbar arrays including at least a first and a last crossbar array;
each crossbar array including row wires and column wires wherein bit patterns representative of numerical values are stored in a plurality of columns of the crossbar array and wherein the bit patterns store data in the form of high or low resistance states; and
an output unit electrically connected to the rows of the last crossbar array configured to sum the numerical values stored in the columns of the last crossbar array.

17. The processor of claim 16, wherein an output of each row of the first crossbar array is connected to an inverting input of an op-amp including a feedback resistor, an output of each op-amp is connected to an input of an A/D converter, and outputs of each A/D converter are connected to the inputs of half adder circuits or full adder circuits.

18. The processor of claim 16, wherein an output of each row of the first crossbar array is connected to an inverting input of an op-amp including a feedback resistor, an output of each op-amp is connected to an input of an A/D converter, and outputs of each A/D converter are connected to the inputs of logic gates used to control load timing into another crossbar array.

* * * * *